United States Patent
Bradley et al.

(10) Patent No.: US 11,846,663 B1
(45) Date of Patent: Dec. 19, 2023

(54) REMOTE MULTIPORT MODULAR VECTOR ANALYZER SYSTEM AND METHOD OF USE

(71) Applicant: ANRITSU COMPANY, Morgan Hill, CA (US)

(72) Inventors: Donald Anthony Bradley, Morgan Hill, CA (US); Paul William Davis, Morgan Hill, CA (US); Aaron Roderick Miller, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 17/392,046

(22) Filed: Aug. 2, 2021

Related U.S. Application Data

(60) Provisional application No. 63/127,777, filed on Dec. 18, 2020, provisional application No. 63/059,694, filed on Jul. 31, 2020.

(51) Int. Cl.
  *G01R 27/28* (2006.01)
  *G01R 35/00* (2006.01)

(52) U.S. Cl.
  CPC .......... *G01R 27/28* (2013.01); *G01R 35/005* (2013.01)

(58) Field of Classification Search
  CPC ............... G01R 27/28; G01R 35/005
  See application file for complete search history.

(56) References Cited

U.S. PATENT DOCUMENTS

| | | | | |
|---|---|---|---|---|
| 5,245,291 A | * | 9/1993 | Fujimura | H04N 7/102 324/644 |
| 7,482,976 B2 | * | 1/2009 | Plesinger | H01Q 3/267 342/368 |
| 10,145,930 B1 | * | 12/2018 | Betts | G01R 27/32 |
| 10,473,704 B2 | * | 11/2019 | Pandya | G01R 27/06 |
| 2016/0359330 A1 | * | 12/2016 | Jin | H02J 50/50 |
| 2018/0246153 A1 | * | 8/2018 | Pandya | G01R 27/06 |
| 2019/0198999 A1 | * | 6/2019 | Ashrafi | H01Q 25/04 |
| 2020/0256911 A1 | * | 8/2020 | Lang | G01R 27/28 |

OTHER PUBLICATIONS

Giordano, Raffaele et al., "High-Speed Deterministic-Latency Serial IO," (excerpt), IntechOpen, Field Programmable Gate Array, Edited by George Dekoulis, pp. 1-21 (May 31, 2017); retrieved on Apr. 17, 2023, from Internet webpage https://www.intechopen.com/chapters/53730.

* cited by examiner

*Primary Examiner* — Akm Zakaria
(74) *Attorney, Agent, or Firm* — KILPATRICK TOWNSEND & STOCKTON, LLP

(57) ABSTRACT

Systems and methods for incorporating multiple single-port vector network analyzer modules where the modules can be located at significant distances from each other. Systems and methods are provided for synchronizing source signals with remote receivers, calibration, operation, bandwidth reduction, high isolation, and reliable solar power or remote sites whereby the VNA module s may be used for characterization of a DUT as if they were incorporated into a single vector network analyzer chassis with access to a common clock.

20 Claims, 32 Drawing Sheets

$$\text{APPROX } R_X = L_m (T°C \#257.3517) / 508.28$$
$$= L_m(.5555) @ 25°C$$
$$= (100+50+25+5+1)(.5555)$$
$$= 100.5 \Omega$$
$$100 R_X = 10,050 \quad \text{CLOSEST R} = 7660$$
$$N = \text{INT} (.5 + 2.56 \frac{100.5 + .77.7660}{100.5})$$
$$= 153$$
$$R_X = 7660 \frac{D}{1600.N - D}$$
$$= 7660 \frac{D}{244800 - D}$$

$$T°C = \frac{R_X}{L_m} .508.28 - 257.3517$$
$$= \frac{100.493}{181} .508.28 - 257.3517$$
$$= 24.851$$

CHECK
$$D = 1600.N \frac{R_X}{R + R_X}$$
$$= 1600.153 \frac{100.5}{7660 + 100.5}$$
$$= 3170$$
$$R_X = 7660 \frac{3170}{244800.3110}$$

| R | °C | °C CAL | ° ERR |
|---|----|--------|-------|
| 50.56 | 0 | -.365 | -0.37 |
| 51.59 | 5 | 4.870 | -.013 |
| 52.64 | 10 | 10.207 | +0.21 |
| 53.68 | 15 | 15.493 | +0.49 |
| 54.69 | 20 | 20.627 | +0.63 |
| 55.53 | 23 | 24.896 | -0.10 |
| 56.44 | 30 | 29.776 | -0.22 |
| 57.45 | 35 | 34.655 | -0.35 |
| 58.48 | 28 | 39.890 | -0.11 |
| 59.99 | 15 | 45.024 | +0.02 |
| 60.51 | 13 | 50.210 | +0.21 |

$$C = (\frac{R}{L_m} .508.28) - 257.3517$$

FIG. 6C

```
  X  Y
R 1, 2 = 9
R 1, 3 = 21
R 1, 4 = 5       STEP 2
R 1, 5 = 1       CLOSEST TO 4
R 1, 6 = 32      CLOSEST TO 1
R 1, 7 = 27        STEP 4
R 1, 8 = 23
R 2, 3 = 12
R 2, 4 = 14
R 2, 5 = 8       STEP 8
R 2, 7 = 18      LOOK UP
R 2, 8 = 14      CLOSEST TO 5
R 3, 4 = 26        STEP 6
R 3, 5 = 20
R 3, 6 = 11
R 3, 7 = 6
R 3, 8 = 2       CLOSEST TO 8
R 4, 5 = 6         STEP 7
R 4, 6 = 37      END TO END (R)
R 4, 7 = 32        STEP 1
R 4, 8 = 28
R 5, 6 = 31
R 5, 7 = 26
R 5, 8 = 22
R 6, 7 = 5       CLOSEST TO 6
R 6, 8 = 9         STEP 3
R 7, 8 = 4       CLOSEST TO 7
                   STEP 5
```

COMBINING STEPS
2,3  4,5  6,7  8

*SW1 ELECTRICAL CONNECTION END UNIT LEFT
SW2 ELECTRICAL CONNECTION END UNIT RIGHT
USED SO NO END UNIT SFP AND FIBER
JUMPER ARE NEEDED $$\emptyset = \frac{360 \cdot d \cdot f}{C, V_p}$$

d = LENGTH M   f = FReQ HZ
C = 299.8×10⁸ m/s  $V_p$ = | FOR A.R, .67 FOR FIBER, .88 FOR RG8 COAX $$\emptyset = \frac{2 \cdot 360 \cdot d \cdot f}{C, V_p}$$

EXAMPLE, d = 100m, FIBER, f = 1MHZ to 43.5GHZ $\emptyset = 3.584 \times 10^{-4} \cdot f$

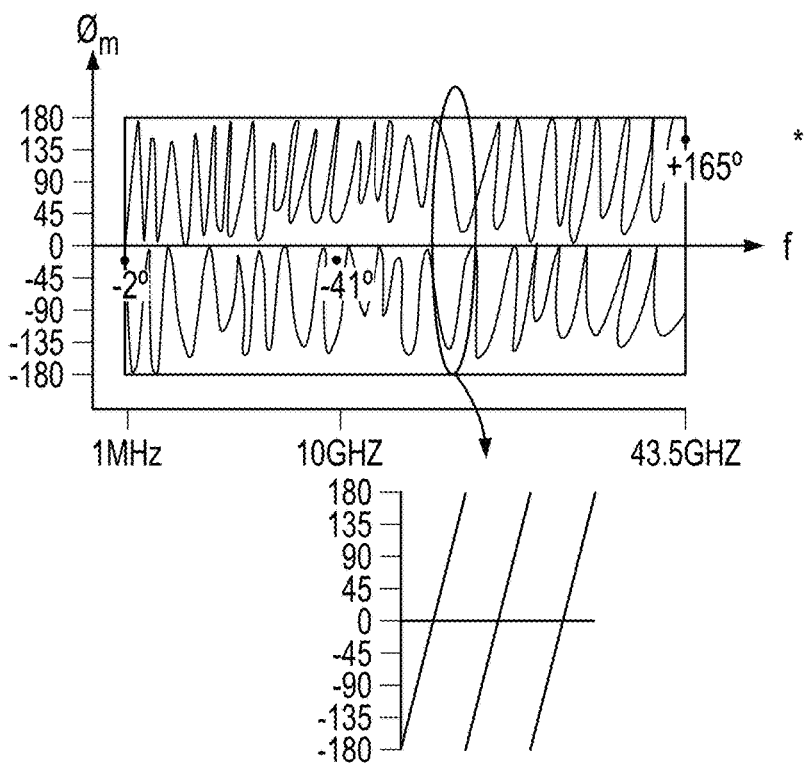

* $\emptyset_m = \emptyset_{ACTUAL} - 360_{AINT}(\emptyset/360)$ ($\emptyset_{ACTUAL}$ MOD360)
  IF $\emptyset_m > 180$ THEN $\emptyset_m = \emptyset_m - 360$ (ROLL OVER IF $\emptyset_{ACTUAL} > 180$)
  IF $\emptyset_m < -180$ THEN $\emptyset_m = \emptyset_m + 360$ (ROLL OVER IF $\emptyset_{ACTUAL} < -180$
  NORMALIZE $\emptyset_m$ (COMPLEX DIVIDE $\emptyset_m/\emptyset_m$)

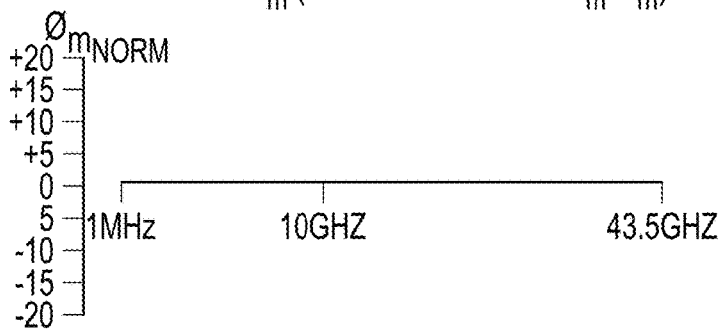

SUBJECT 100m CABLE TO +10°C INCREASE IN TEMPERATURE.
EQUIVALENT Ø CHANGE CORRELATES TO 1° PHASE FOR 100m LENGTH
FOR 1°C TEMPERATURE CHANGE AT 43.5GHZ OR .01° PHASE FOR 1m $$\Delta d = \frac{\Delta\emptyset \cdot C \cdot V_p}{360 \cdot \rho} = \frac{.01 \cdot 299.8 \times 10^6 \cdot .67}{360 \cdot 43.5 \times 10^9} = 1.283 \times 10^{-7} \text{ m/m/°c}$$

A 1m LENGTH WOULD STRETCH TO 1.000001283m FOR 10°C CHANGE@43.5GHZ
A 100m LENGTH WOULD STRETCH TO 100.0001283m FOR 10°C CHANGE@43.5GHZ
A 200m LENGTH WOULD STRETCH TO 200.0002565m FOR 10°C CHANGE@43.5GHZ

.0001283m = 128.3µm = 39µ" = .039miles

FIG. 9B

FIBER CABLE IS QUITE TEMPERATURE STABLE CHANGING LENGTH ONLY 128.3mm OVER A 100m SPAN CAUSING A CORRESPONDING 10° PHASE CHANGE FOR 10° TEMPERATURE CHANGE AT 43.5GHZ

FOR A 200m LENGTH THE PHASE CHANGE WOULD BE 20° FOR THE SAME 10°C TEMPERATURE CHANGE.

COMPLEX DIVIDE $\emptyset_m$ STORED/$\emptyset_m$ REAL TIME

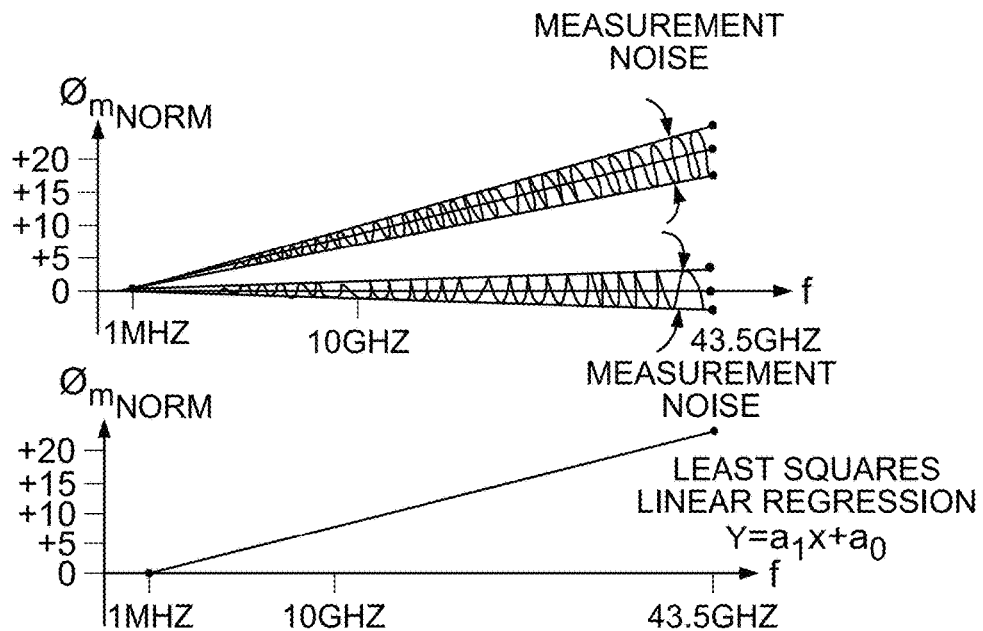

MEASUREMENT NOISE ADDED (ACTUAL Øm ≈ 4°rms@43.5GHZ REDUCING LINEARLY WITH FREQUENCY. ie 0.4°rms@4.35GHZ FOR A 200m LENGTH TAKING A LEAST SQUARES LINEAR REGRESSION OF A SWEEP THEN SUBTRACTING 1/2 THE SLOPE FROM THE NEXT SWEEP REAL TIME MEASUREMENT DATA CORRECTS FOR THE ONE WAY PHASE CHANGE OUT TO FIBER. LEAST SQUARES CALCULATION REDUCES THE MEASUREMENT NOISE DUE TO SUMMATION OF NUMBER OF POINTS TAKEN, USUALLY >201. PROBLEMS OCCUR WHEN SLOPE IS CLOSE TO 0. THIS OCCURS WHEN $\Delta F$ IS NARROW OR AFTER INITIAL NORMALIZATION WHERE SLOPE = 0. AN ACCEPTANCE $r^2$ VALUE OF ≈.85 IS NEEDED BEFORE A CALCULATED SLOPE AND OFFSET CAN BE USED, ALSO NOT USEABLE WHEN FREQUENCY LIST IS USED WHERE FREQUENCIES ARE NOT LINEARLY SPACED.

FIG. 9D

USING THE LEAST SQUARES LINEAR REGRESSION ALGORITHM HAS TWO THINGS THAT ARE USEFUL
1) IT AVERAGES ALL POINTS REDUCING NOISE
2) IT COMPUTES THE $\alpha 1$ AND $\alpha 0$ TERMS NEEDED FOR A SLOPE AND OFFSET CALCULATION IT ALSO HAS NO NEED FOR ACTUAL FREQUENCY WHICH MAKES THE CALCULATION OVERLY COMPLICATED.

A MUCH SIMPLER APPROACH WOULD BE TO MEASURE 2 POINTS ON THE DATA AND AVERAGE THEM INDEPENDENTLY.

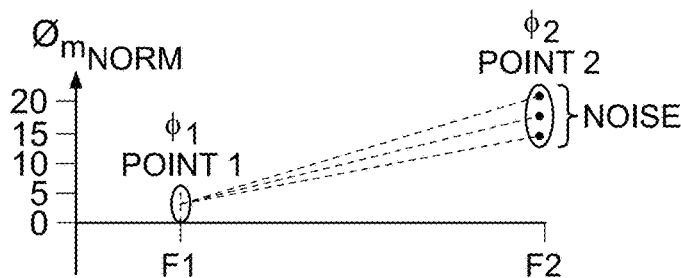

AVERAGING P1 $\quad 201\left(\dfrac{F1}{43.5GHZ}\right)$

AVERAGING P2 $\quad 201\left(\dfrac{F2}{43.5GHZ}\right)$

SLOPE $= \dfrac{\phi_2 - \phi_1}{F_2 - F_1}$

INTERCEPT $= \phi_0$ OR $\phi$ AT 0° CROSSING

WE KNOW $\phi_0 = 0°$ AT DC, SO F1 = 0

THAT LEAVES POINT 1 = 0 OR

SLOPE $= \dfrac{\phi_2 - 0}{F_2 - 0}$ OR

SLOPE $= \dfrac{\phi_2}{F_2}$

INTERCEPT = 0

USING ANY F AND KNOWING THE TEST FREQUENCY ALLOWS CALCULATING THE PHASE AT ANY OTHER FREQUENCY OR $\phi_F = \dfrac{\phi}{FIRST}, F; \quad \dfrac{\phi}{FIRST} = K, \phi_F = K \cdot F$   AVERAGE 201 TIMES

FIG. 9E $F_{LO} > F_{RF}$

① $F_{IF} = F_{LO} - F_{RF}$ $F_{LO} = N \cdot F_{SYNC}$ $F_{SYNC} = F_{IF}$

② $F_{LO} = N \cdot F_{IF}$ $N = 1 + F_{RF} / F_{IF}$

TARGET $F_{IF} \approx 10$ Mhz $N_P = INT(1 + F_{RF} / F_{IF}) = INT(1 + F_{RF}/10)$ $F_{IF} = F_{RF}/(N_P - 1)$ $F_{LO} = F_{RF} + F_{IF}$

INTEGER DIV/N ALGORITHM

REMOTE MULTIPORT MODULAR VECTOR ANALYZER SYSTEM AND METHOD OF USE

PRIORITY

This application claims the benefit of priority to U.S. Provisional Application No. 63/059,694 filed Jul. 31, 2020 entitled "MODULAR TWO PORT VECTOR NETWORK ANALYZER SYSTEM"; and to U.S. Provisional Application No. 63/127,777 filed Dec. 18, 2020 entitled "REMOTE MULTIPORT TRANSMISSION PHASE CALIBRATION IN A MODULAR VECTOR ANALYZER SYSTEM" which provisional applications are incorporated herein by reference in their entirety.

TECHNICAL FIELD

The present disclosure relates generally to vector network analyzers and more particularly to modular systems and methods for vector network analysis which allow remote placement of VNA modules. In particular the present disclosure relates to systems and methods for synchronization, calibration, and operation of for multi-modular VNA systems.

BACKGROUND

A common task in RF and microwave engineering involves the analysis of circuits using a network analyzer (VNA). The VNA is a reflectometer-based electronic instrument that can be used to measure the frequency response (magnitude and phase) of a device under test (DUT) such as an electrical network, component, circuit, or sub-assembly. This VNA can evaluate nearly all types of RF and microwave devices, including, filters, amplifiers, and complex multifunction and integrated systems. A Vector Network Analyzer contains both a source, used to generate a known stimulus signal, and a set of receivers, used to determine changes to this stimulus caused by the device-under-test or DUT. One or more receivers can be used to measure signals reflected from the DUT or transmitted through the DUT in order to characterize the properties of the DUT. The stimulus signal is injected into the DUT and the Vector Network Analyzer measures both the signal that's reflected from the input side, as well as the signal that passes through to the output side of the DUT. The Vector Network Analyzer receivers measure the resulting signals and compare them to the known stimulus signal. The measured results are then processed by either an internal or external PC and sent to a display.

Vector Network Analyzer's perform two types of measurements—transmission and reflection. Transmission measurements pass the VNA stimulus signal through the DUT, which is then measured by the Vector Network Analyzer receivers on the other side. The most common transmission S-parameter measurements are S21 and S12 (Sxy for greater than 2-ports). Swept power measurements are a form of transmission measurement. Some other examples of transmission measurements include gain, insertion loss/phase, electrical length/delay and group delay. Comparatively, reflection measurements measure the part of the VNA stimulus signal that is incident upon the DUT, but does not pass through it. Instead, the reflection measurement measures the signal that travels back towards the source due to reflections. The most common reflection S-parameter measurements are S11 and S22 (Sxx for greater than 2-ports).

Typically a VNA makes use of a frequency sweeping source or stimulus, directional couplers, and one or more receivers that provide ratioed amplitude and phase information such as reflection and transmission coefficients. The VNA utilizes scattering (S)-parameters to evaluate the characteristics of the device under test (DUT) with a high level of precision. S-parameters are a desirable method for measurement because they are relatively easy to derive at high frequencies and are directly related to parameters of interest including gain, return loss, and reflection coefficient. These parameters derived by use of the VNA are essential during design and testing of RF and microwave devices. The measurements made by the VNA can be analyzed to characterize the properties of the DUT over the range of frequencies of interest.

Vector network analyzers (VNA) are instruments that measure the magnitude and phase of signals as they pass through and/or are reflected from devices under test (DUTs). Conventional Vector Network Analyzers comprise several test ports and receivers in a single chassis where they have direct access to common clock and reference signals. Typically, a DUT is connected to 2 or 4 ports of the VNA at connectors with short lengths of cable; however, there are some applications where the connectors of the DUT are very far away, and it is not feasible to connect the DUT connectors to the VNA with test port cables. For instance, if the DUT is coaxial cable installed in a building, one end of the cable may be hundreds of meters away from the other. The DUT could also be a radio link with transmitting and receiving antennas positioned very far apart.

There is a need for network analyzers capable of measuring transmission magnitude and phase (s21) through DUTs that have input and output ports which are far apart. Moreover, where those ports are far apart there is a need for systems and methods for synchronization, calibration and operation for VNA ports separate by large distances.

SUMMARY OF THE INVENTION

The present disclosure describes a modular VNA system which utilizes two or more single port VNA modules connected by cables to each other and a controlling computing system. The VNA modules can be connected to ports of a DUT that are far apart. Each VNA module contains both a source, used to generate a known stimulus signal, and a set of receivers, used to determine changes to this stimulus caused by the device-under-test or DUT. The stimulus signal is injected into the DUT from one or more VNA modules, and the remote VNA modules cooperate to measure signals that are reflected from the input side, as well as the signals that pass through to the output side of the DUT. The receivers of the VNA modules measure the resulting signals and compare them to the known stimulus signal. The VNA modules transmit signals, communicate, and are synchronized via the cables connecting the VNA modules to each other and a computer.

In particular the present disclosure describes systems and methods for VNA transmission phase calibration for multiple remote ports suitable for use in a modular VNA system which utilizes multiple single port VNA modules, remote from one another, and connected by cables to each other and a controlling computing system.

In an embodiment the present disclosure describes a single port VNA module suitable for use in a modular multi-port VNA system.

In an embodiment the present disclosure describes a multi-function extender for use in a modular multi-port VNA system.

In an embodiment the present disclosure describes a modular two-port VNA system comprising two single port VNA modules connected by cables.

In an embodiment the present disclosure describes an alternative configuration for a modular two-port VNA system comprising two single port VNA modules and two multi-function extenders connected by cables.

In an embodiment the present disclosure describes a high isolation configuration for a modular two-port VNA system.

In an embodiment the present disclosure describes multi-segment distributed temperature measurements performed with a multi-port modular VNA system.

In an embodiment the present disclosure describes a fast algorithm for arranging N objects in shortest order implemented with performed with a multi-port modular VNA system.

In an embodiment the present disclosure describes synchronous zero latency fiber optic interconnect for Instrumentation such as a multi-port modular VNA system.

In an embodiment the present disclosure describes synchronous zero latency fiber optic interconnect for instrumentation such as a multi-port modular VNA system.

In an embodiment the present disclosure describes optimized PhaseLync DeltaPhi algorithm suitable for a multi-port modular VNA system.

In an embodiment the present disclosure describes clock regeneration over USB suitable for a multi-port modular VNA system connected by USB cables.

In an embodiment the present disclosure describes time base distribution over USB3 suitable for a multi-port modular VNA system connected by USB cables.

In an embodiment the present disclosure describes wide band frequency transmission over a band limited medium suitable for a multi-port modular VNA system.

In an embodiment the present disclosure describes synchronization of a remote wide band receiver using a narrow band low frequency signal suitable for a multi-port modular VNA system.

Further objects and advantages of the present invention will become apparent to those skilled in the art from the following detailed description of the various embodiments, when read in light of the accompanying drawings.

BRIEF DESCRIPTION OF THE DRAWINGS

FIGS. 6A-6C illustrate multi-segment distributed temperature measurements performed with a multi-port modular VNA system according to an embodiment.

FIGS. 9A-9E illustrate optimized PhaseLync DeltaPhi Algorithm suitable for a multi-port modular VNA system according to an embodiment.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

In various embodiments the present invention provides systems and methods for incorporating multiple vector network analyzer modules where the modules can be located at significant distances from each other. The modules, when connected, can be operated and controlled in the same way as if they were parts of an integrated multiport vector network analyzer. In order to overcome issue that arise with remote VNA modules, systems and methods are provides for synchronizing source signals with remote receivers, bandwidth reduction, high isolation, and reliable solar power or remote sites. The various systems and methods described herein can be used separately or in combination to improve the performance of multiple-module vector network analyzer systems and in particular systems having modules separated by large distances.

Modular Vector Network Analyzer System

Figure 1A:
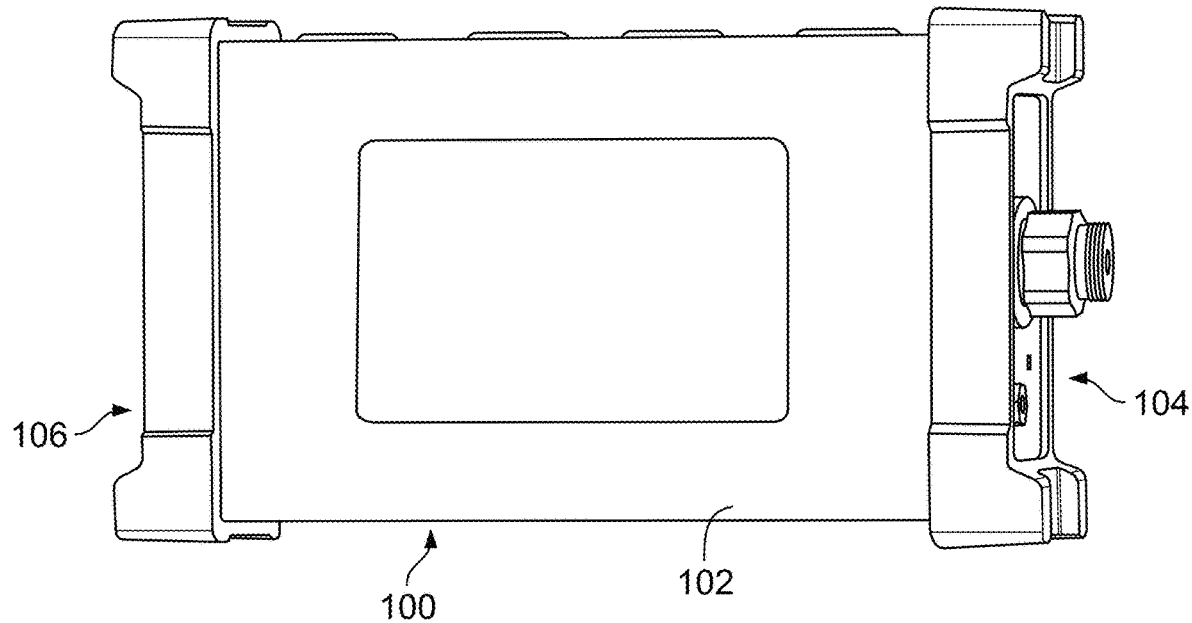
FIGS. 1A-1C show views of a single VNA module of a modular multi-port VNA system according to an embodiment.
Figure 1B:
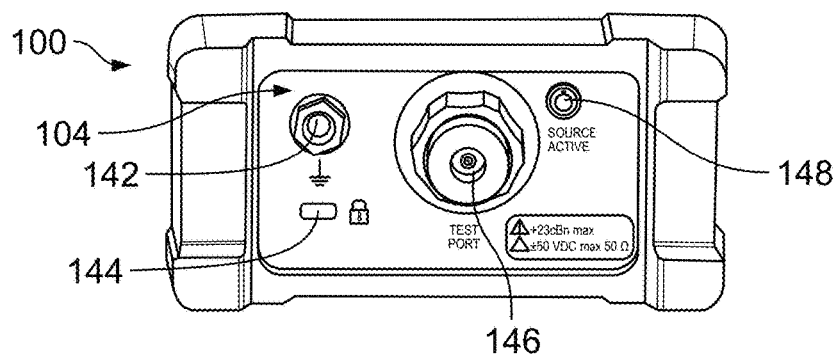
Figure 1C:
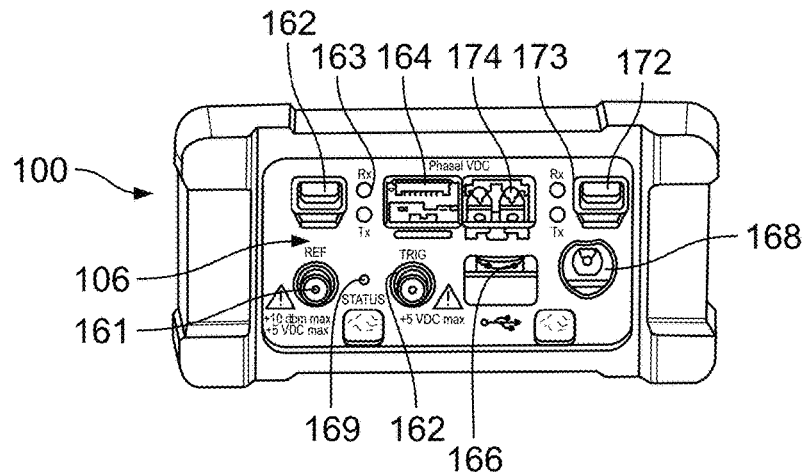
Figure 2A:
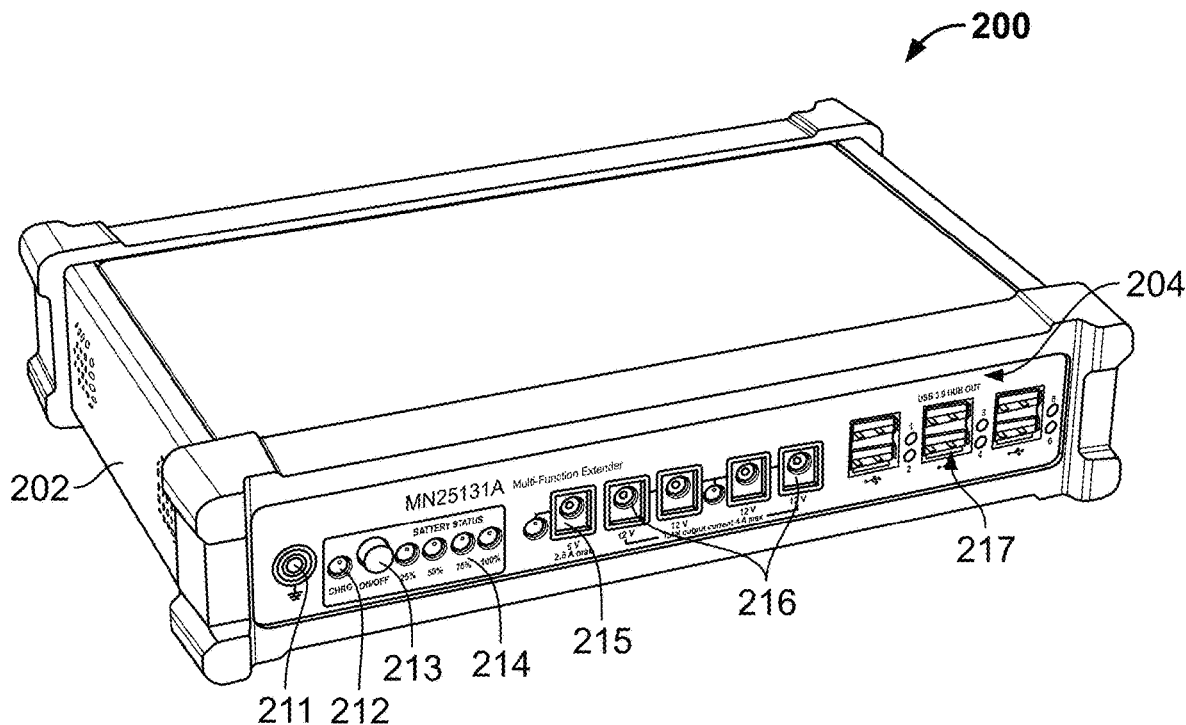
FIGS. 2A-2D show views of a multi-function extender for use in a modular multi-port VNA system according to an embodiment.
Figure 2B:
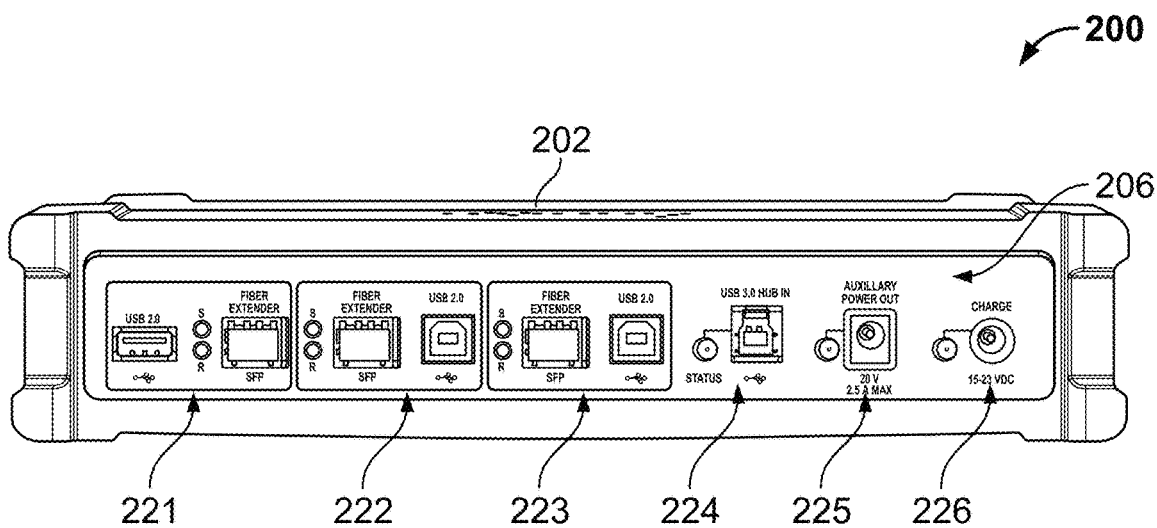
Figure 2C:
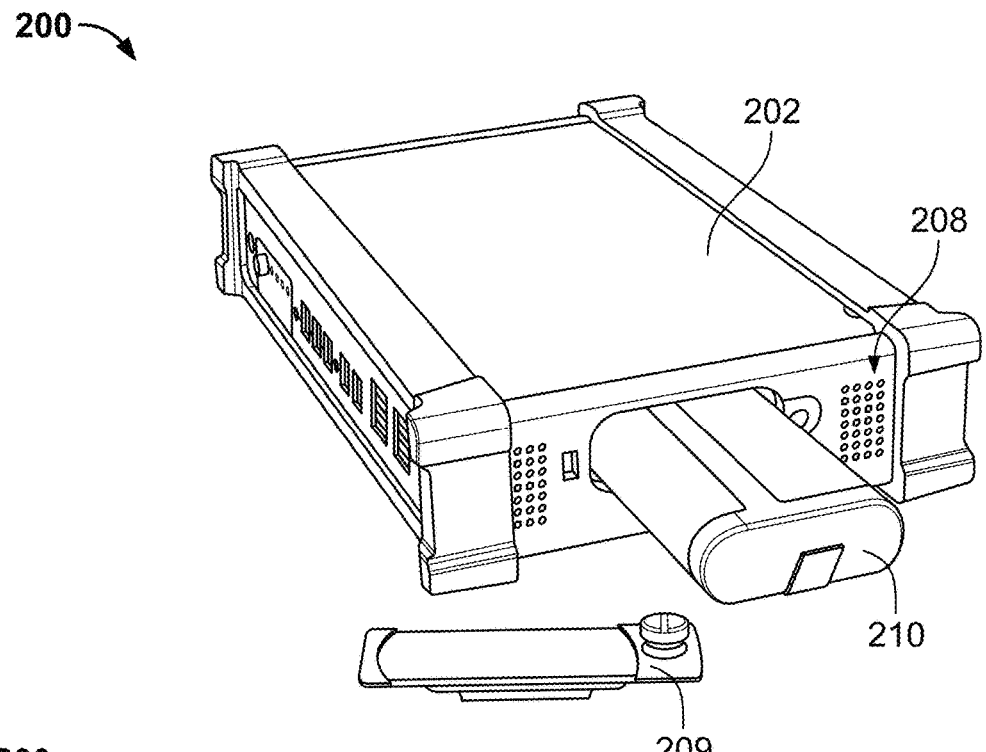
Figure 2D:
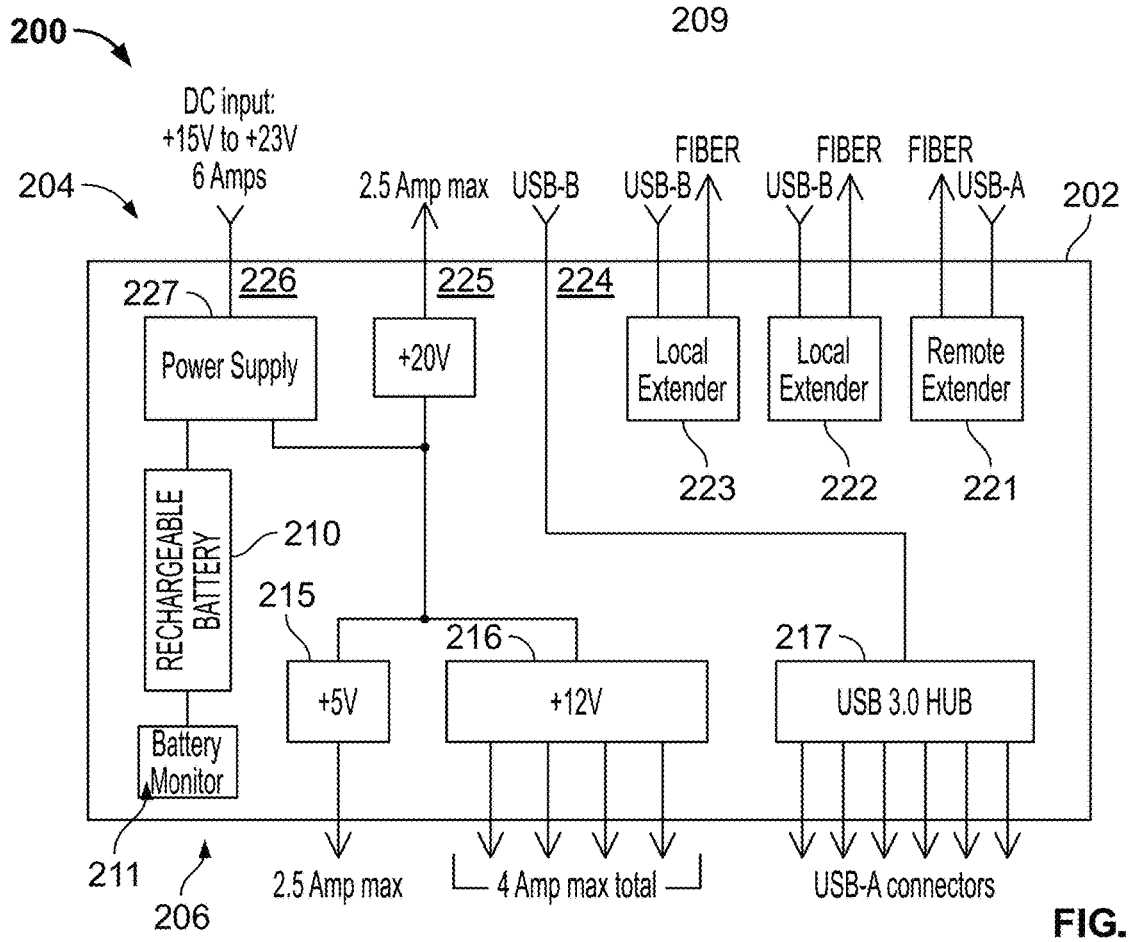
Figure 3:
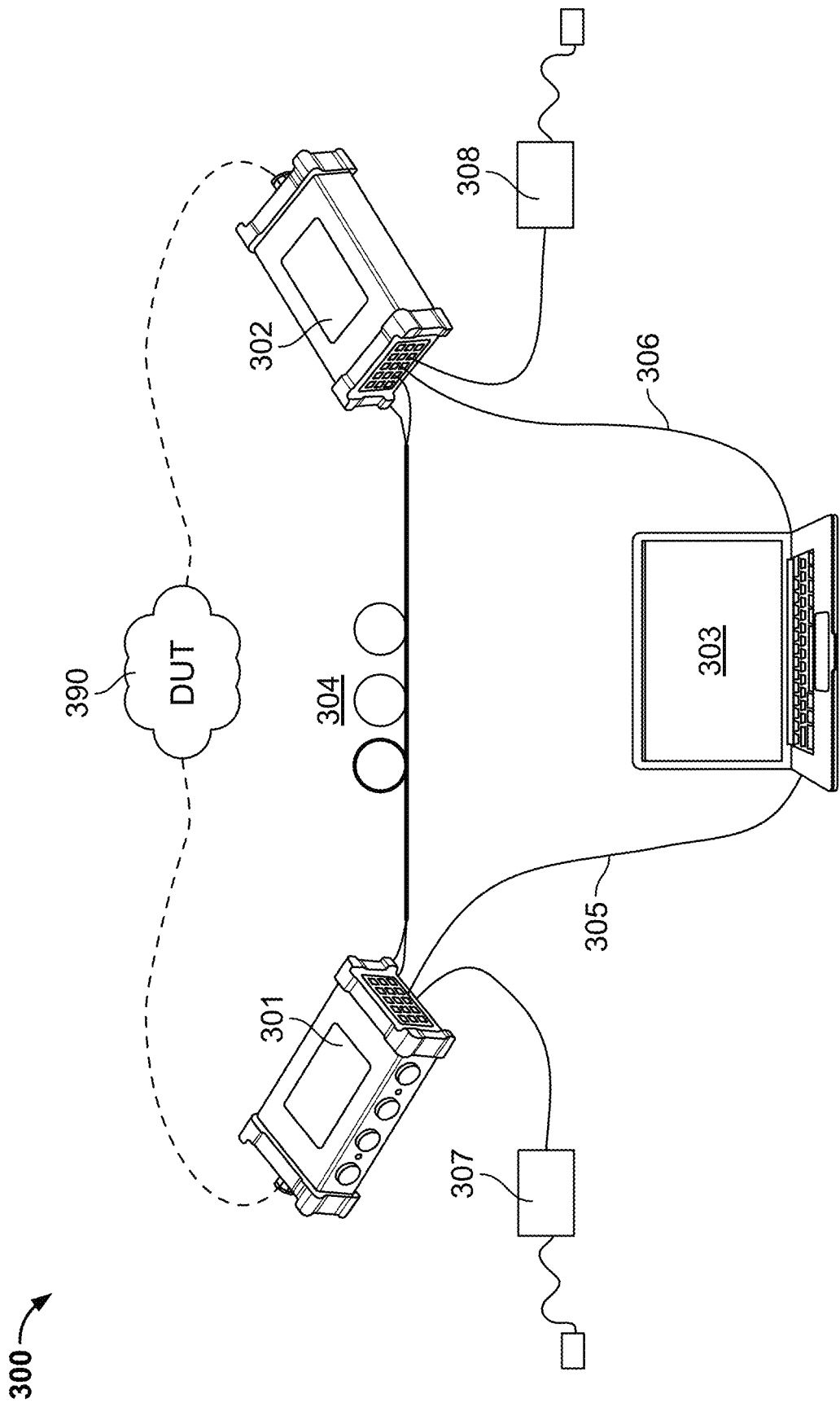
FIG. 3 shows a modular two-port VNA system according to an embodiment.
Figure 4A:
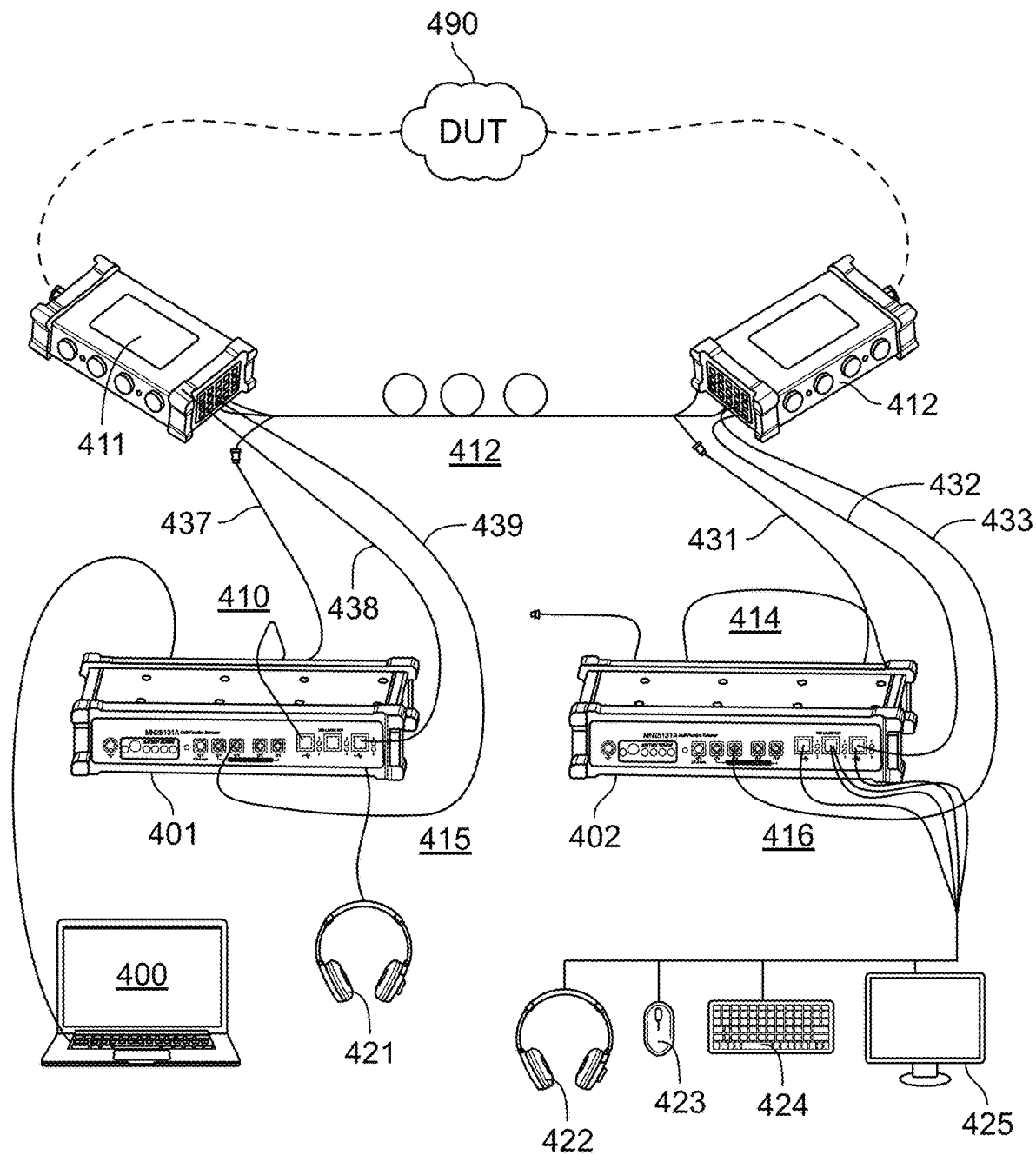
FIGS. 4A and 4B show an alternative configuration for a modular two-port VNA system according to an embodiment.
Figure 4B:
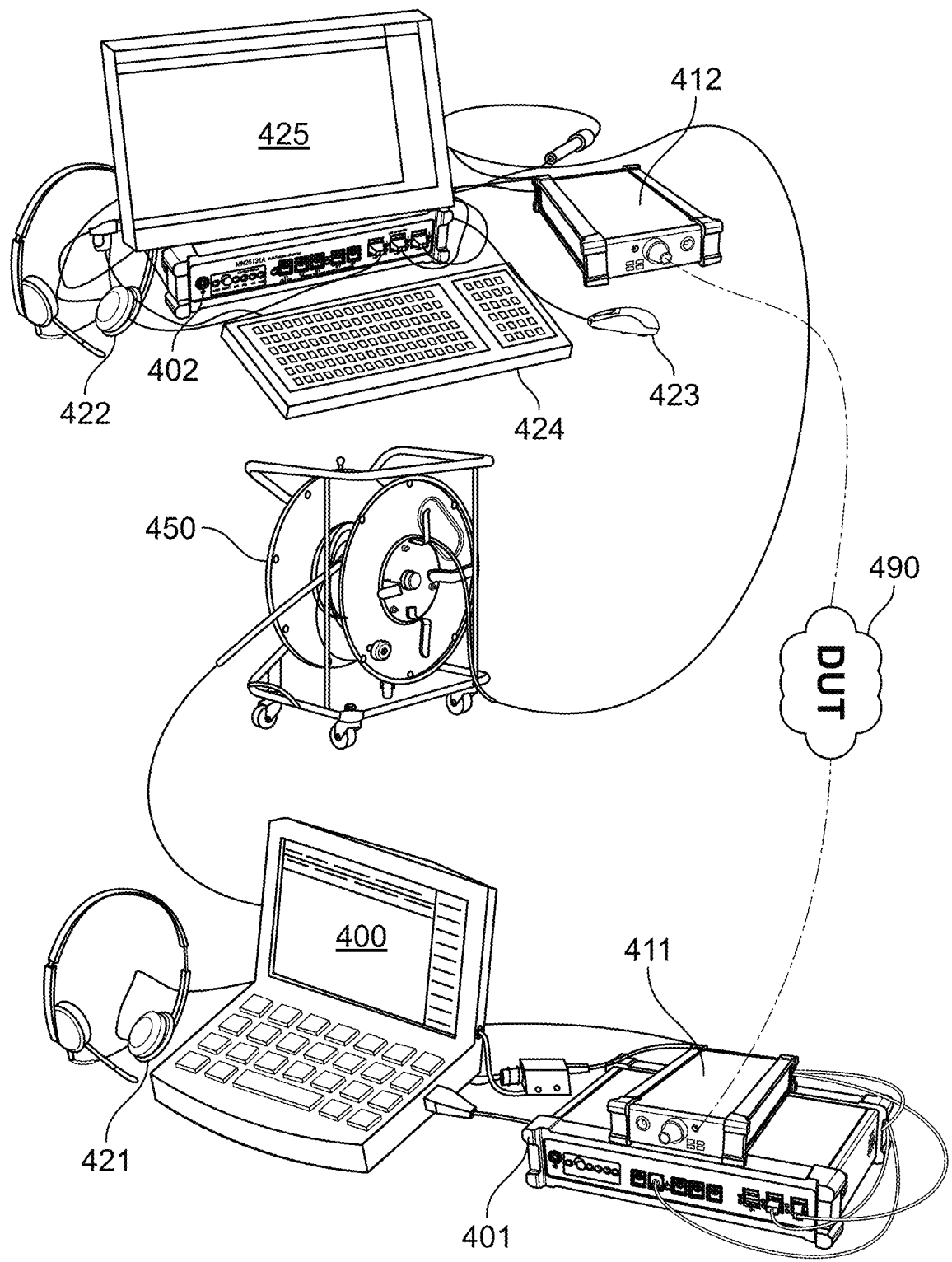

The Modular VNA system is shown in FIGS. 1A through 4B. FIGS. 1A-1C show aspects single port VNA modules. FIGS. 2A-2D illustrate the multifunction extenders. An analyzer system comprises two (or more) single port VNA modules with the PhaseLync™ option. PhaseLync™ cabling directly connects two VNA modules. 2 and 5 meter setups as shown in FIG. 3 using two separate PhaseLync™ cables: PhaseLync electrical cable (PLE) and PhaseLync™ optical cable (PLO). For longer distance between test ports, 25 meter and longer setups as shown in FIGS. 4A and 4B, a single combined PhaseLync™ cable is used between Multi-Function Extenders as shown in FIGS. 4A and 4B. Although two VNA modules are shown, multiple module configurations can be achieved by daisy chaining the devices.

A computer such as a laptop is connected to the VNA modules by cables. The modular VNA system provides the ability to make vector S-parameter measurements of device under test (DUT) over a large displaced physical distance between the two VNA modules. Depending on the separation, the two modules can be controlled directly by one PC and two USB interfaces as shown in FIG. 3 (distances up to 5 meters), or by one PC and USB extensions provided by two Multi-Function Extenders as shown in FIG. 4A and 4B (for distances starting from 5 to 25 meters or longer). The Multi-Function extenders also allow the user to operate a two-port vector system in environments where AC power is difficult to access and they provide flexibility to place the control of the PC at either end of the system. The system also allows for communication between operators located at the site of each module which is useful during system configuration and setup.

Single Port VNA Modules with PhaseLync Ports

FIGS. 1A-1C show views of a single port VNA module with the PhaseLync™ option. FIG. 1A shows a top view of housing 102 of VNA module 100. FIG. 1B shows a view of the front panel 104 of VNA module 100. FIG. 1O shows a view of the rear panel 106 of VNA module 100.

The VNA module 100 is an instrument system that contains a built-in source, test set, and analyzer. The VNA module 100 is a 1-port portable and modular USB VNA that is controlled from an external PC running control software. Designed for simple engineering, manufacturing, and educational applications, the VNA module 100 supports manual test programming through a Graphical User Interface. Test results can be displayed real time on an external PC. Screen captures can easily be printed or saved in common graphic file formats. The VNA module 100 is controlled through USB from an external PC. The VNA module runs the software providing a powerful graphical user interface for debugging and manual testing of devices, as well as command syntax for comprehensive remote control programming.

The VNA MODULE 100 provides a maximum frequency range from 1 MHz to 43.5 GHz AND has up to 16,001 total test points available with up to 16 channels with 16 trace display graphs per channel. Each trace can have up to 12 standard markers and one reference marker. Two VNA modules 100 with PhaseLync™ installed can be synchronized together to form a 2-port bidirectional VNA. The PhaseLync™ option allows the pair of VNA modules to be physically separated by 100 meters or more and still make calibrated vector s-parameter measurements as discussed below.

FIG. 1A shows a top view of housing 102 of VNA module 100. Housing 102 enclosed the circuitry of VNA module 100. The VNA module 100 is a modular 1-port VNA that is configurable as single or dual 1-port VNAs, or as a fully reversing vector 2-port VNA with optional PhaseLync™ technology. The VNA module can be provided in three frequency ranges: 1 MHz to 8/20/43.5 GHz, and is capable of S-parameter and time domain measurements. The VNA module 100 is based on VNA-on-chip technology, which simplifies the internal VNA architecture at high frequencies, reduces instrument cost, and enhances accuracy and measurement repeatability. The combination of low cost and good performance makes the VNA module 100 ideal for testing 1-port RF and Microwave passive devices to 43.5 GHz. Connectors and ports are provided on front panel 104 and rear panel 106.

FIG. 1B shows a view of the front panel 104 of VNA module 100. Front panel 104 includes a variety of front panel connections including: ground receptacle 142, security lock 144, and test port 146. An LED indicator 148 is provided to indicate that the source is active.

FIG. 1O shows a view of the rear panel 106 of VNA module 100. Rear panel 106 includes a variety of front panel connections including: PLE Receptacle 160, coaxial connector for reference signal 161, coaxial connector for trigger signal 162, optical fiber SFP receptacle 164, USB port 166, and Power connector 168. Tx and Rx Led indicators 163 are provided. As well as a module status indicator LED 169.

The small form-factor pluggable (SFP) is a compact, hot-pluggable network interface module used for both telecommunication and data communications applications. An SFP interface on networking hardware is a modular slot for a media-specific transceiver in order to connect a fiber-optic cable or sometimes a copper cable. The advantage of using SFPs compared to fixed interfaces (e.g. modular connectors in Ethernet switches) is that individual ports can be equipped with any suitable type of transceiver as needed. By eliminating the need to maintain surplus units/ devices of various fiber types for network repairs or upgrades Small Form Pluggable Optical Transceivers reduce network equipment inventories. SFPs allow one product the flexibility to expand by speed (Fast Ethernet and 1, 10, or 40 Gigabit), and/or distance (220 m to 80 km).

PhaseLync™ is enabled with two additional connectors including SFP Receptacle 174 and PLE receptacle 172. A second set of Tx and Rx Led indicators 173 are provided for the PL connection. The PhaseLync™ option enables two VNA modules 100 to phase synchronize enabling full 2-port S-parameter measurements on passive RF and Microwave devices. The option supports synchronization between two VNA modules to distances of 100 meters or greater, enabling this configuration to address applications where vector transmission measurements over distance is required.

Multi-Function Extender

FIGS. 2A-2D show views of a multi-function extender for use in a modular two-port VNA system according to an embodiment. The Multi-Function Extender provides USB hub and communication extension, multiple voltage outputs, and battery power capabilities to enable remote use of USB instruments. The extender plays an important role in supporting the ability for 25 meter separation of the two VNA modules 100 (shown in FIGS. 1A-1C) in a Modular 2-Port Network Analyzer System. USB to SFP (small form-factor pluggable fiber-optic transceivers) allow two extenders to make a USB communications link over distances via fiber optic cables. An internal rechargeable battery system enables remotely powering measurement instruments such as VNA modules in locations that are not necessarily close to AC line power.

FIG. 2A shows a front panel view of extender 200. FIG. 2B shows a rear panel view of extender 200. FIG. 2C shows a side view of extender 200. FIG. 2D shows a block diagram of extender 200. As shown in FIG. 2A, the front panel 204 of housing 202 of extender 200 includes a plurality of connectors and indicator lights. As shown in FIG. A, a ground lug 211 connects to chassis ground to ground the housing of the extender 200. A Charge LED 212 indicates power and charging status. The charge LED 212 shows, Green if external supply is >15 V; Orange if external supply is <15 V; and off if no external supply is connected. An on/off switch 213 turns the battery status indicators 214 on or off. The battery status indicators 204 are used to indicate charge status of an internal battery. The battery status indicators 21 provided on the front panel include four LEDS which show internal battery charge status 25% range for each LED. For example if 50% LED is on then battery is charged from 26 to 49%. 25% LED will turn Orange if charge is <10%. 25% LED will flash Orange is charge is <5%. All four LEDs will flash green if charge is =100%. Battery fully discharged if no status LEDs are illuminated. LEDs will flash randomly if external supply is applied and no battery is inserted.

The extender includes one +5 V, four +12 V, and one +20 V supply connections. The inclusion of a six-port USB HUB allows the extender to support multiple USB devices and interface accessories that may be part of a measurement application. As shown in FIG. 2A a 5V supply connector 215 is provided on front panel 204. +5 Volt Supply provided up to 2.5 Amps to external devices. LED is Green when connector is inserted. LED will turn orange when >2.2 A is drawn. LED will extinguish when >2.5 A are drawn. As shown in FIG. 2A, four 12V supply connectors 216 are provided on front panel 204. +12 Volt Supply provides up to 4 Amps to external devices. LED is Green when connector is inserted. LED will turn orange when >2.2 A is drawn. LED will extinguish when >2.5 A are drawn. LED is Green when connector is inserted in any of the four. LED will turn orange when >3.7 A is drawn from the supply. LED will extinguish when >4.0 A are drawn. As shown in FIG. 2A, the front panel 204 also includes 6 USB ports 217. Six USB 3.0 Connections are provided on the front panel. The bub input is on the rear panel 206 of extender 200. Each USB 3.0 connector has an LED indicator that shows of activity present.

FIG. 2B shows a rear panel view of extender 200. The rear panel include three fiber extender ports 221, 222, 223. The USB to Fiber converters are used to drive the fiber cable that extends the USB communications between extenders used in long-distance installations. They consist of either USB-A or USB-B 2.0 connectors which are converted to LC Duplex drivers. The USB 2.0 connections drive a USB 2.0 to Bi-directional Fiber Optic SFP (small form-factor pluggable) converter. The type A USB 3.0 connector is plugged into the Hub USB 3.0 type B connector with a short 1.5 foot patch cable. Only USB 2.0 signals are passed, so the HUB drops down to High Speed USB 2.0 operation. This completes the path from the Host computer to the Remote Multi-function Extender via Full Duplex fiber optic cable with support for lengths in excess of 100 meters. The Type A connector at the remote device side supplies +5 V@1 A for the converter. Power is disabled if no optical receive signal is detected. This has the benefit of disabling all USB HUB activity if the fiber connection is broken, allowing shut down of the Remote Extender by simply disconnecting the fiber optic connection at the Host side. When no optical power is detected, a low-duty-cycle power up of the SFP+Transceiver tests for optical power on the receiver. If power is detected, full power is applied. Testing for optical power occurs every 10 Seconds and consumes very little battery power. Removal of the SFP in the fiber extender with the Type A USB connection disables the testing for long term non-operation.

The rear panel includes fiber extender port 221, an USB Type A to SFP Optical Fiber Converter S (send) and R (receive) LEDs indicate Activity on the Fiber Outputs This converter enables the system power only when optical power is sensed at its SFP input. The rear panel includes fiber extender port 222, an USB Type-B to SFP Optical Fiber Converter S and R LEDs indicate Activity on the Fiber Outputs. The rear panel includes fiber extender port 223, an USB Type-B to SFP Optical Fiber Converter S and R LEDs indicate Activity on the Fiber Outputs. The rear panel includes USB Type-B Input port 224 to Front Panel HUB Status LED is Green when bus activity is present. The rear panel includes a 20 v output port 225 for powering external devices. 20 V Power Supply –LED turns green when a connector is inserted. –LED will turn orange when >2.3 A is drawn. –LED will extinguish when >2.5 A is drawn. The rear panel also includes an input port 206 to connect to an external power supply. External Supply Input-Charge indicator is green if input voltage is >15 V. -Charge indicator is orange if input voltage is <15 V.–Charge rate is 4 Amps. The system can be powered by mains power, if available. When supplying power to the equipment, connect the accessory power supply to a 3-pin grounded power outlet connected in turn to local AC Mains.

FIG. 2C shows a view of side panel 208 of extender 200. As shown in FIG. 2C a removable rechargeable battery 210 can be inserted through an opening in housing 202. There is no power ON/OFF switch. With the battery installed the unit is active as long as there is still charge on the battery. A cover 209 is secured to the housing 202 after battery 210 has been installed. A fully charged battery has a 94 watt-hour capacity. When the battery is charged to 100% the four status LEDs will blink in unison on and off when the battery indicator is switched on. If the external AC/DC power supply is connected when there is no battery, then the four LEDs will blink randomly. Removing the charger or battery while operating does not interrupt the power supplies or the USB communications.

FIG. 2D shows a block diagram of the extender 200. An internal power supply module 227 receives power from DC input 226 and provides power to the 5V 12 v and 20 v outputs 215, 216, 225 of the extender. Power can be provided to DC input 226 by a mains supplied AC to DC transformer (power brick) where such mains power is available. Alternatively power can be provided to DC input 226 by a solar panel for remote operation where mains power is unavailable or unreliable. The power supply module 227 also charges battery 210 and withdraws power from battery 210 in the absence of external DC power.

The USB to Fiber converters 221, 222, 223 are used to drive the fiber cable that connects two extender modules. They consist of either USB-A or USB-B 2.0 connectors which are converted to LC Duplex drivers. The USB 2.0 connections drive a USB 2.0 to Bi-directional Fiber Optic SFP (small form-factor pluggable) converter. The type A USB 3.0 connector is plugged into the Hub USB 3.0 type B connector with a short 1.5 foot patch cable. Only USB 2.0 signals are passed, so the HUB drops down to High Speed USB 2.0 operation. This completes the path from the Host computer to the Remote Multi-function Extender via Full Duplex fiber optic cable with a maximum length of 300 m. The Type A connector at the remote device side supplies +5 V at 1 A for the converter.

Power is disabled if no optical receive signal is detected. This has the benefit of disabling all USB HUB activity if the fiber connection is broken, allowing shut down of the Remote Extender by simply disconnecting the fiber optic connection at the Host side. When no optical power is detected, a low-duty-cycle power up of the SFP+Transceiver tests for optical power on the receiver. If power is detected, full power is applied. Testing for optical power occurs every 10 seconds and consumes very little battery power. Removal of the SFP in the fiber extender with the Type A USB connection disables the testing for long term non-operation thereby conserving battery for units which may not have access to main power.

Two extenders are connected via fiber optic cables to allow USB operation over a long distance (farther than the 5-meter limit for USB 2.0 wired connections). The fiber extenders in each unit are used to drive a fiber optic cable pair that emulates a USB bus interface. One unit uses the USB-A to Fiber Extender to interface with one of the two USB-B to Fiber Extenders on the second extender module.

Short Distance Setup

One typical configuration for a modular two-port modular VNA system 300 is shown in FIG. 3. A driving PC 303 is connected by USB cables 305 and 306 directly to two VNA modules 301 and 302. The VNA modules support manual test programming through a Graphical User Interface on the driving PC 303. Test results can be displayed real time on the external PC. Screen captures can easily be printed or saved in common graphic file formats. The VNA modules are controlled through USB from the external PC. The VNA module runs the software providing a powerful graphical user interface for debugging and manual testing of devices, as well as command syntax for comprehensive remote control programming.

Each of VNA modules 301 and 302 is provided with its own power supply 307 and 308. The VNA modules are connected via the PhaseLync™ connection ports by Phase-Lync™ cables 304 which connect the electrical and optical signals between the VNA modules 301 and 302. The test ports of the VNA modules are connected to the DUT 390. This configuration is suitable for up to 5 meter separation between the two VNA modules 301 and 302. The modules, when connected, can be operated and controlled in the same way as if they were parts of an integrated multiport vector network analyzer. Particular methods for synchronization, calibration and operation of the modular VNA system are described below.

Long Distance Setup

Another typical configuration for using the multi-function extender in a modular two-port VNA system is shown in FIGS. 4A and 4B. A driving PC 400 connects to the USB-B HUB input on the rear panel of a first extender module 401. A USB cable 410 is connected from one of the USB-A connectors on the front panel and goes to the USB-B connector of one of the two USB B to Fiber Extenders on the rear panel of the extender module 401. The combined PhaseLync™ cable 412 connects the PhaseLync™ optical and electrical signals between extender 401 and extender 402. Then the Fiber Extender is connected using the USB-A connector on the rear panel of the second extender module 402. The output of the USB-A connector on the Fiber Extender with the USB-A connection is then cabled to the USB-B HUB input on the rear panel by USB cable 414. This then enables the front panel USB Hub on extender module 402 to function as an extension of the driving PC 400.

A wide variety of accessories may be connected via this remote USB to facilitate analysis processes. For example a headset 421 connected to extender 401 can be used to communicate with headset 422 connected to extender 402 thereby allowing multiple operators to communicate. Moreover a mouse 423 keyboard 424 and screen 425 can be used by an operator from remote access and control of laptop 400. Thus allowing a single operator to control testing from either location. Additional USB devices may also be connected and controlled over this hub including for example cameras, actuators, microphones and the like as may be useful in a particular scenario.

Each extender 401, 402 is also connected to a VNA module 411, 412 by fiber cables 437 and 431 and USB cables 438 and 432. The extenders 401 420 also provide power to the VNA modules via DC power cables 439, 433 so that no separate power source for the VNA modules is required. The test ports of the VNA modules are connected to DUT 490. As shown in FIG. 4B a cable bundle 450 can be used to manage the optical and conductive cables connecting the extender 401 local to the controlling PC 400 and the remote extender 402.

The test ports of the VNA modules 411 and 412 are connected to the DUT 490. This configuration is suitable for 25 meter or greater separation between the two VNA modules 411 and 412. The modules, when connected, can be operated and controlled in the same way as if they were parts of an integrated multiport vector network analyzer. Particular methods for synchronization, calibration and operation of the modular VNA system are described below.

Source Synchronization

In order for remote VNA receivers (such as the receivers of the VNA modules of the system of FIGS. 3, 4A and 4B) to cooperate to measure the properties of a DUT, the modules need to be precisely synchronized. The phase sensitive receivers used in each of the VNA modules with largely separated ports are required to be synchronized to a single source of one of the VNA modules. Such synchronization is necessary so that phase measurements at each of the modules can be compared in synchrony. Such synchronization is difficult to achieve when the VNA modules are separated by significant distances. The cabling between devices can cause signal attenuating, phase-shifting, drift, attenuation or noise which desynchronizes the receivers. Accordingly, special systems and methods must be used to obtain and maintain synchronization.

Some approaches to separating ports on a VNA include extending the ports by RF cables or more recently for very long separation approaching 100 m, converting the source signal to optical magnitude and phase sending it to the remote location converting from optical back to original magnitude and phase source signal. A forward coupler is then placed at the RF output and the Incident RF is converted to optical and returned to the instrument and converted back to electrical for use as leveling and reference phase. However, this is a one way process, as all signals converted to optical are high level. This moves the source RF signal at great distance while retaining a phase reference at its output. However this approach is not applicable to remote receiving of signals because the received RF signal being too low for processing by the high noise E/O and O/E converters. In both the above mentioned cases, no synchronization is needed between the two ports.

The modular VNA system described herein provides for separation of the receiver from the source in a two or more port VNA and controlling the receiver as if it were still inside the VNA. Many signals are needed to allow this physical separation of the receiver. This application presents a novel approach to the synchronization of the needed signals allowing full reversing operation on multiple ports.

A single phase sensitive receiver can be constructed using a mixer, an IF filter, an IF amplifier an A/D converter and 3 Digital signals. The LO for the mixer, the clock for the A/D and the serial A/D output contain all the needed information. For example, consider a 10 GHz signal is being received. Let the IF be 400 KHz and the A/D sample 8X the IF. A 400 KHz reference signal and a 10.0004 GHz LO signal are sent to the receiver. The 400 KHz is multiplied by 8 to clock the A/D. This provides an 8 sample 45 degree segmented representation of the magnitude and phase of the received IF waveform referenced to the 400 KHz reference signal. The 400 KHz is also multiplied by 8X16 to serialize 8 samples for output from the 16 bit A/D. A faster clock could be used for more bits as the X16 multiple is not important to the synchronous operation. It only has to be fast enough to serially transfer all bits before the next 400 KHz IF signal is complete. This provides for synchronized digitized receive information.

If the same 400 KHz and 10.0004 GHz is applied to a local mixer at the source and connected to the incident arm of a forward coupler which is attached to the source and connected to a similar IF chain and A/D, then the two ports can be synchronized with respect to the 400 KHz reference. The relationship of b2 the receiver and a1 the source can be divided in complex form to provide b2/a1 or S21.

Many receivers can be synchronized with these same drive signals. Each receiver would send its serialized data back to the source for processing. The A/D outputs can be daisy chained from one receiver to the next with each receiver containing a FPGA to combine the downstream outputs to a single chain of data which can be presented to the FPGA in the source for decomposing into the separate outputs from each receiver.

The received chain at the source would be N receiver cycles delayed from the present source A/D. Reconstruction of a delayed source for each receiver would resynchronize the proper ratio of receiver to source. A daisy chain has the advantage of using only a bundle of three fibers going from the source to the first receiver and another single bundle of three fiber cables going to the next receiver and so on. It should be noted that all these signals are digital with no regard to amplitude other than to be large enough to provide adequate drive to the circuits. These signals can be transformed to fiber using E/O and O/E converters (e.g. SFP) allowing remote distances of over 5 km between the source and receiver and between 1 km and 5 km per daisy chained N receivers.

This technique is used in the multi-port VNA system of FIGS. 3, 4A and 4B using the PhaseLync™ connections. In the implementation illustrated in FIGS. 5A and 5B the reference and a new signal "Sync" are transferred using twisted pair copper conductors 510 between VNA module 501 and VNA module 502. The LO is transmitted over optical cables 512 enabling long distance separation due to low transmission loss in fiber at Microwave frequencies. The use of optical connections for transmission of LO is much more robust than transmission by conventional coaxial cables. The system can automatically sync the receivers—in comparison use of coaxial connectors for remote synchronization is very sensitive to any movement of the coaxial connector. Even slight movement of the coaxial connectors conventionally used induce significant phase changes that require lengthy manual recalibration to calibrate out.

A "Sync" signal is used to indicate when all units are ready. The VNA modules allow two way transmission where any unit can become a source and all other units become receivers of the source. This more complicated arrangement requires duplex operation of the LO, Reference, Sync and A/D output. The previously mentioned "Sync" signal is implemented in a Party Line arrangement where all units monitor the Party Line waiting for it to assert True. When all units are ready they start processing the A/D outputs for the present frequency data point. All units bring the "Sync" line False in a wire "Or" arrangement.

If averaging is required, all VNA modules operating as receivers take the same number of averages. When complete, each VNA module receiving the LO releases the "Sync" line back to its True state. The remaining unit on the Party Line, the LO and RF synthesizers, hold the "Sync" line False until RF, LO and Incident IF are settled. At this time the "Sync" signal is released to its True state allowing the next frequency data point to be acquired. Programming of the PLL synthesizers and A/D processing is done over a USB connection at each unit. All units are controlled by a master control program with remote USB HUB distribution such as the multi-function extender described herein.

The synchronization system and method provides for phase synchronization of a frequency source in one VNA module with a remote VNA module operating as a receiver. Multiple VNA module receivers can be synchronized with the same source. All synchronizing signals are digital. In embodiments the system can use fiber optics to remote receivers up to 5 km from the source. The source can be used with a single remote receiver or multiple receivers can be daisy chained. The Source and LO can be at any position in the daisy chain using full duplex connection between units with a dedicated Party Line Sync signal using daisy chained connections between the receiver and a controller.

Existing means of synchronizing two remote ports of a VNA' require cabling of the LO, or multiple LOs if multiple down conversions are used, and the A/D clock to the transmission port receiver. These signals are needed to retain the phase component of the received test signal to the reference signal at the source. Practical considerations prevent LO signals in the microwave region from being extended beyond several meters.

Figure 13A:
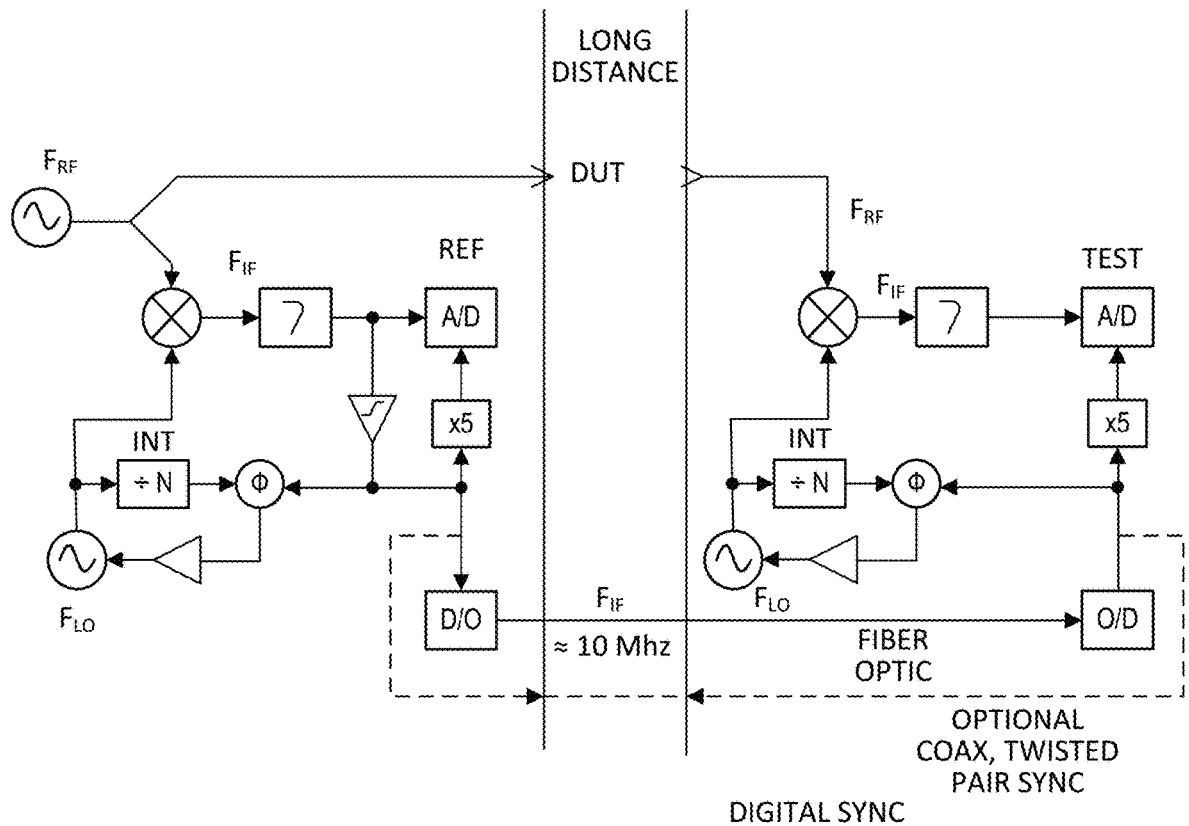
FIGS. 13A-13C illustrate synchronization of a remote wide band receiver using a narrow band low frequency signal suitable for a multi-port modular VNA system according to an embodiment.
Figure 13B:
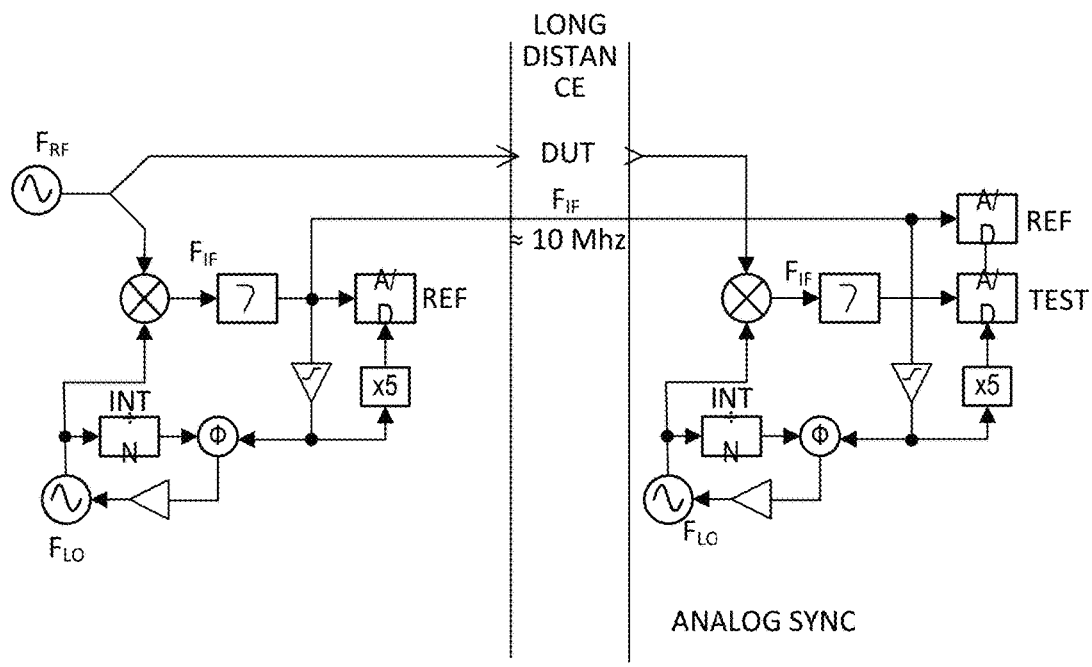
Figure 13C:
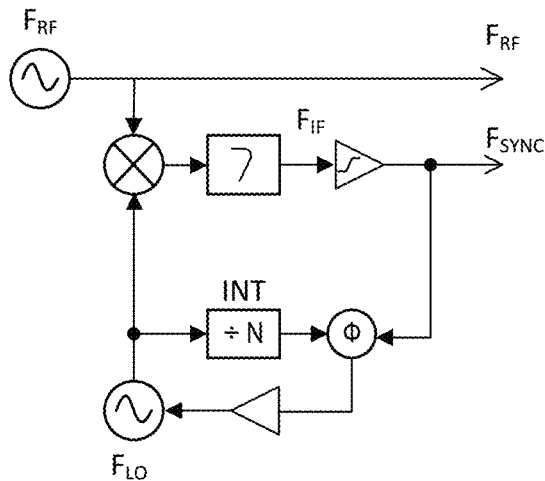

FIGS. 13A-13C illustrate synchronization of a remote wide band receiver using a narrow band low frequency signal suitable for a multi-port modular VNA system according to an embodiment. In embodiments the present modular VNA system provides a receiver architecture that needs only one narrow band low frequency signal from the generator source port to the remote receiver port to retain down-converted as well as A/D clocking while retaining absolute phase information over the complete test frequency operational range as shown in FIGS. 13A-13C. Single low frequency narrow band synchronization connection between source and receiver FIGS. 13A and 13B. Fiber Optic cable with digital sync to Optical and Optical to Digital converter is show in FIG. 13A, Coax or Twisted pair cables can be used for short distances as shown in FIG. 13A dashed line. An analog sync embodiment is illustrated in FIG. 13B. The same cable connection can be used for reversing measurements with simple reversing switches. The synchronization signal can be analog to retain reference amplitude information at received end for non-leveled source as shown in FIG. 13B. There are no integer limitations on the Source generator. FIG. 13C illustrate an algorithm for integer DIV/N to generate one narrow band low frequency signal from the generator source port to the remote receiver port.

Transmission Phase Calibration

As shown in FIGS. 3, 4A and 4B, a modular VNA system comprises two (or more) single port VNA modules with the PhaseLync™ option. PhaseLync™ cabling connects the two or more VNA modules. 2 and 5 meter setups as shown in FIG. 3 have two separate PhaseLync™ cables: PhaseLync™ electrical cable (PLE) and PhaseLync™ optical cable (PLO). 25 meter and longer setups as shown in FIGS. 4A and 4B utilize a single combined PhaseLync™ cable. Although two modules are shown, multiple module configurations can be achieved by daisy chaining the devices. The ports of the VNA modules are remote from one another. There is a need to perform transmission phase calibration for those ports. However conventional methods for phase calibration cannot be used over long distances.

This invention allows the phase portion of a transmission calibration to be constructed using the return path of the LO signal to the remote receiver. The method allows two approaches for calibration. The method can be utilized in multiport modular VNA setups where all ports are separated by far distances.

First Transmission Calibration approach. Two or more VNA modules units are connected together for the through step needed in an OSLT calibration. Example given for a 100 m distance. The first step in the calibration process is an absolute power calibration of the Test Port output Power. This is done with an accurate traceable power detector over the entire frequency range of the VNA source being calibrated. The source is set to 0 dBm with an accurate 10 dB attenuator at the output test Port. This is needed to diminish the effects of Source/Load match interactions. The calibrations are stored as factory default 0 dBm Source Calibration. Complete the transmission calibration on two VNA units. Connect the pair of VNA modules together with a 1 meter Fiber Interface cable and perform a full 12 term OSLT calibration. Perform a fiber cable length measurement on the 1 meter cable using the Delta F Fiber length measurement routine. There should be one length measurement for each unit in the active LO path. Store these as part of the OSLT calibration. This should allow any random set of VNA units to be used as a pair using this 1 meter fiber Interface cable.

The second step is moving the remote VNA (Port 2) to the end of the extended 100 m Fiber Interface Cable. All calibration values will be the same except the phase portion of the Transmission frequency tracking terms of S21 and S12.

The third step is taking the Fiber cable length measurement on the 100 meter cable using the Delta F Fiber length measurement routine, subtracting the stored exact 1 m length and using this new exact length (~99 m) to determine the phase adjustment needed at each frequency point to produce a flat phase response. Phase can then be calibrated using the formula Phase=−I*F*360/(Vp*3*10^8). The fiber length is described above with respect to source synchronization.

Second Transmission Calibration approach. Transmission Calibration of two or more single port VNAA modules which may never connect to each other for the needed through calibration. These calibrations are done at the individual sites with no physical contact between units. Example given for a 100 m distance. The first step is to perform an absolute receiver calibration using a +10 dBm source driving a 10 dB Pad at the test ports for match error reduction. This provides b1/I and b2/I for the receivers that can be used for accurate power measurements. The internal a1 and a2 (in the receiver direction) should be stored at the same time as the b1 and b2 for LRL use later. The phase of b1 and b2 should be normalized to 0 deg. (Using the locall generated distributed 400 KHz Pseudo Sync as the 0 degree reference). The a1 and a2 phase are rotated to match the normalized b1 and b2 so the b1/a1 and b2/a2 measurements will retain their same phase relationship (again referring to the individual receive directions).

The second step is to perform an absolute power calibration of the Test Port output power as described above. Rotate all phase values to O degree (Using the locally generated distributed 400 KHz Pseudo Sync as the 0 deg reference).

The third step is to perform an OSL calibration on the individual VNA modules. We should now theoretically be able to put a through between the two distant ports, if brought together, and measure a flat b2/a1 and b1/a2 transmission magnitude response. The phase response will show the phase related 100 m length difference between the two units. Thus, the previous steps provide the function of the preliminary through connection in the prior method but without requiring connecting the units with a through.

The fourth step is to perform a fiber cable length measurement on the 100 meter cable using the Delta F Fiber length measurement routine. This allows the exact length to determine the phase adjustment needed at each frequency point to produce a flat phase response. Phase can then be calibrated using the formula Phase=−I*F*360/(Vp*3*10^8). The user can still perform an additional OSL calibration on the individual ports for reflectometer data update. The fiber length is described above with respect to source synchronization.

The synchronization system and method provides for transmission phase synchronization of two or more remote port of a modular VNA system. Transmission phase can be calibrated for multiple modules. In embodiments the system can use fiber optics to remote receivers up to 5 km from the source. Phase transmission can be performed by initially connecting the ports through a 1 m cable (approach one)—or without requiring such connection (approach two). The methods both provide for transmission phase calibration for the ports of two more remote VNA modules.

Optimized PhaseLync™ DeltaPhi Algorithm

There is no present technology using the PhaseLync™ concept. A first attempt of the use of the implementation using traditional concepts had numerous problems, but did enable the PhaseLync™ concept to be proven under certain conditions. FIGS. 9A-9E illustrate optimized PhaseLync DeltaPhi Algorithm suitable for a multi-port modular VNA system according to an embodiment. The purpose of the Optimized PhaseLync™ DeltaPhi Algorithm is calculation of the phase delay in the fiber optic LO connection between 2 or more VNA modules configured in long distance separation of ports while still maintaining phase coherency between units. This allows for synchronization of the VNA modules—a necessity for using multiple VNA modules to make measurements of a DUT (as If they were ports of a single VNA). The invention provides an optimized algorithm for determining frequency dependent phase shift in fiber or coax coupled VNAs or Synthesizers.

The optimized PhaseLync™ DeltaPhi Algorithm is illustrated in FIGS. 9A-9E Test phase can be made at the beginning of sweep allowing single sweep and hold rather than two sweeps needed for other methods. An arbitrary test frequency is used for the Test Phase. The constant "K" (deg/Hz) can be applied to any arbitrary frequency and obtain the phase correction needed at that frequency. A frequency list can be used and an arbitrary number of frequency points can be used. Zero (0) slope CW operation can be used. The method can be used for two or more benchtop VNAs for multiport distance operation. The method can be used to synchronize two or more synthesizers. Synchronization of synthesizers allows for multiple remote VNA modules to be operated as if they were part of single VNA with direct access to one synthesizer.

Synchronous Zero Latency Fiber Optic Interconnect for Instrumentation

In the described embodiments, data and control of the multi-port VNA was accomplished with copper wires consisting of double shielded twisted pairs. The optical cables are used for transmission of the LO signal. The signals needed on the copper wires are active RF 400 KHz analog IF, 400 KHz reference/sync and Busy/Ready. The direction of the IF and Sync signals are provided by separate wires in the cable. The Busy/Ready line is shared by all units in the form of a party line. When all units are ready the Busy/Ready line is released to a high state. This arrangement works as intended, but allows extraneous signals to couple to the outside shield and enter into the environment where the instruments are used. FIGS. 8A-8E illustrate synchronous zero latency fiber optic interconnect for Instrumentation such as a multi-port modular VNA system according to an embodiment.

As an example, Screen Room operation of one of the VNA modules units. Careful RF shielding must be applied to the copper cable entering the chamber for coupled RF elimination. Replacing the copper cable with a full duplex fiber cable would eliminate this path of coupling to the copper cables. Additionally, an all fiber coupling of VNA modules would allow many more uses of the multi-port VNA system. As an example High Voltage test sites where the remote VNA module and its fiber controlled support, Multi-Function Extender, can be mounted on a platform that can be Mega Volts above ground potential.

The problems encountered when contemplating a fiber connection are duplicating the functions needed on the unique requirements of the copper connection as stated earlier. A first cut pass at trying to solve the problem is to use the Serialization/Deserialization (SerDes) implementation on the internal FPGA in the VNA modules. This allows fiber communication between units, but the implementation would have to be heavily modified to provide Zero Latency needed for the 400 KHz Sync signal needed by all units as a reference and Sync Start. A paper Raffaele Giordano, Vincenzo Izzo and Alberto Aloisio (May 31st 2017). High-Speed Deterministic-Latency Serial 10, Field—Programmable Gate Array, George Dekoulis, IntechOpen, DOI: 10.5772/67012. Available from: https://www.intechopen.com/chapters/53730 is incorporated herein by reference and describes deterministic-latency serial 10 implemented in FPGAs. Modification of the SerDes implementation is complicated to implement. Additionally the additional area taken up in the FPGA would force the use of a more costly FPGA core increase the cost of the VNA modules. Additionally the SerDes function is not available in all cores. A costly high BW fiber module (2.5GB/S SFP) will also be needed. Two SFPs will be needed per VNA module for Multi Port operation. Design time will also be needed to define the protocol for assuring all units have access to the data at the same time. The modification need would implement JESD204B Serial I/O protocol and IEE1588 Precision Time Protocol (PTP). These implementations would allow up to 1 uS precision, which would still not produce sufficient precision for use in a multiport VNA module.

Figure 8A:
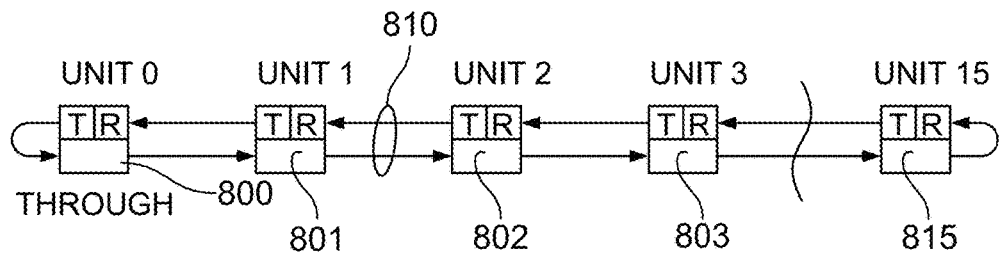
FIGS. 8A-8E illustrate synchronous zero latency fiber optic interconnect for Instrumentation such as a multi-port modular VNA system according to an embodiment.
Figure 8B:
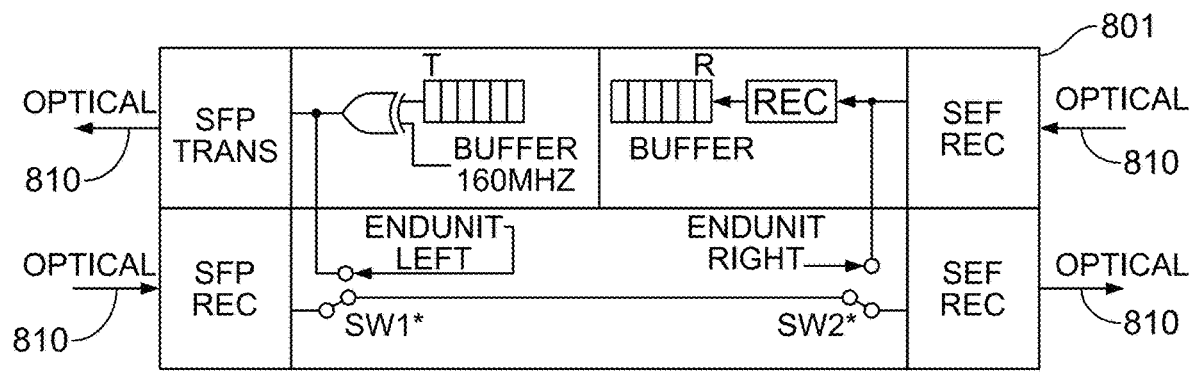
Figure 8C:
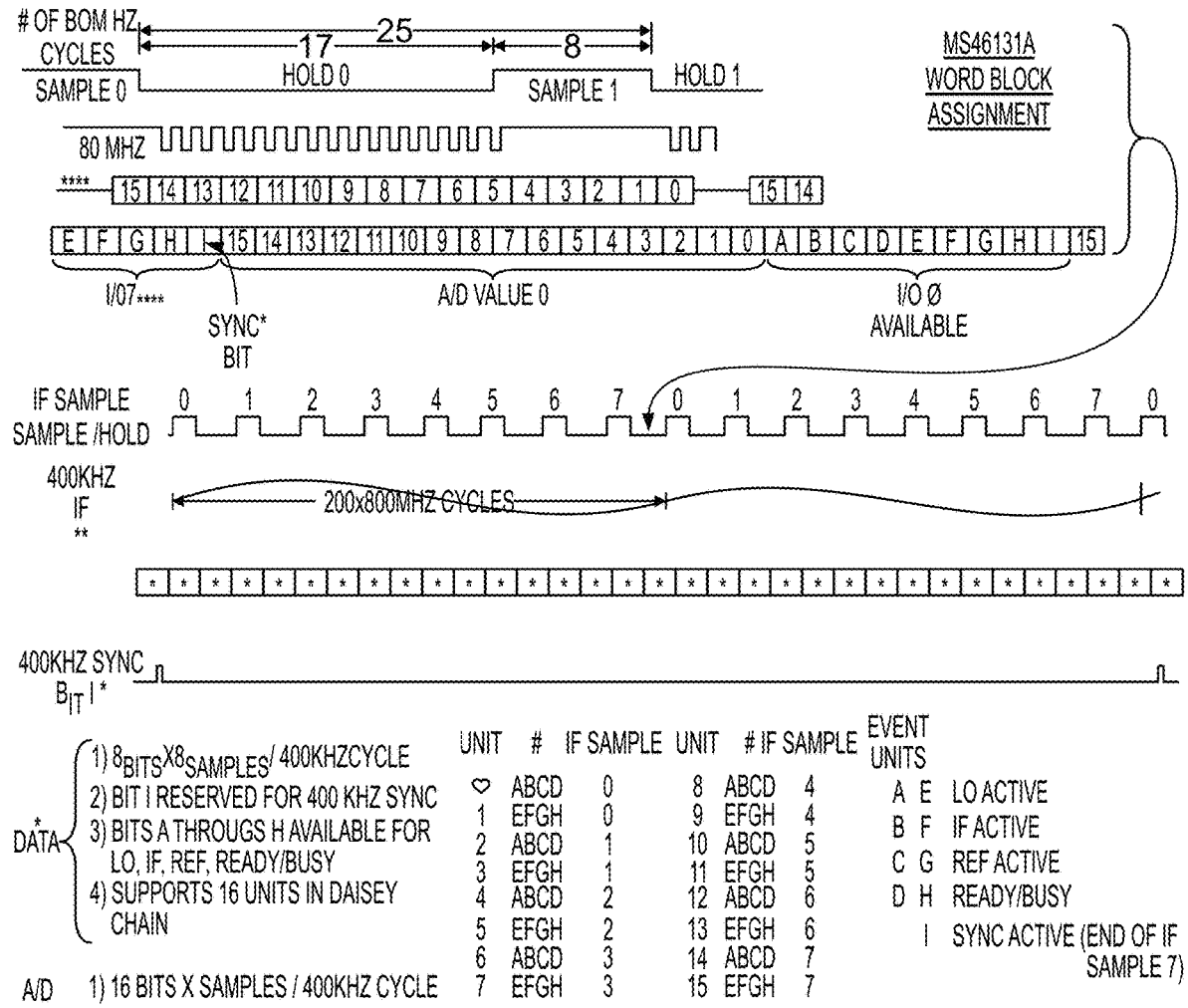
Figure 8D:
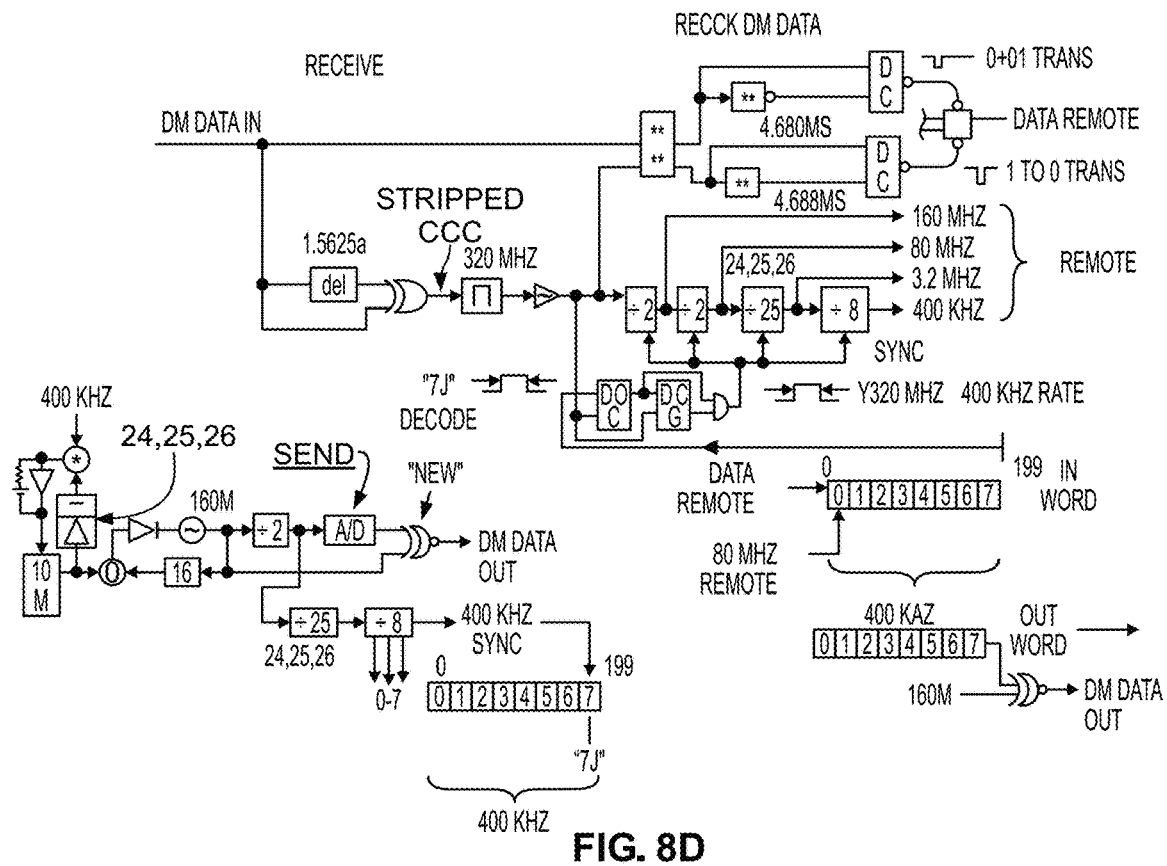
Figure 8E:
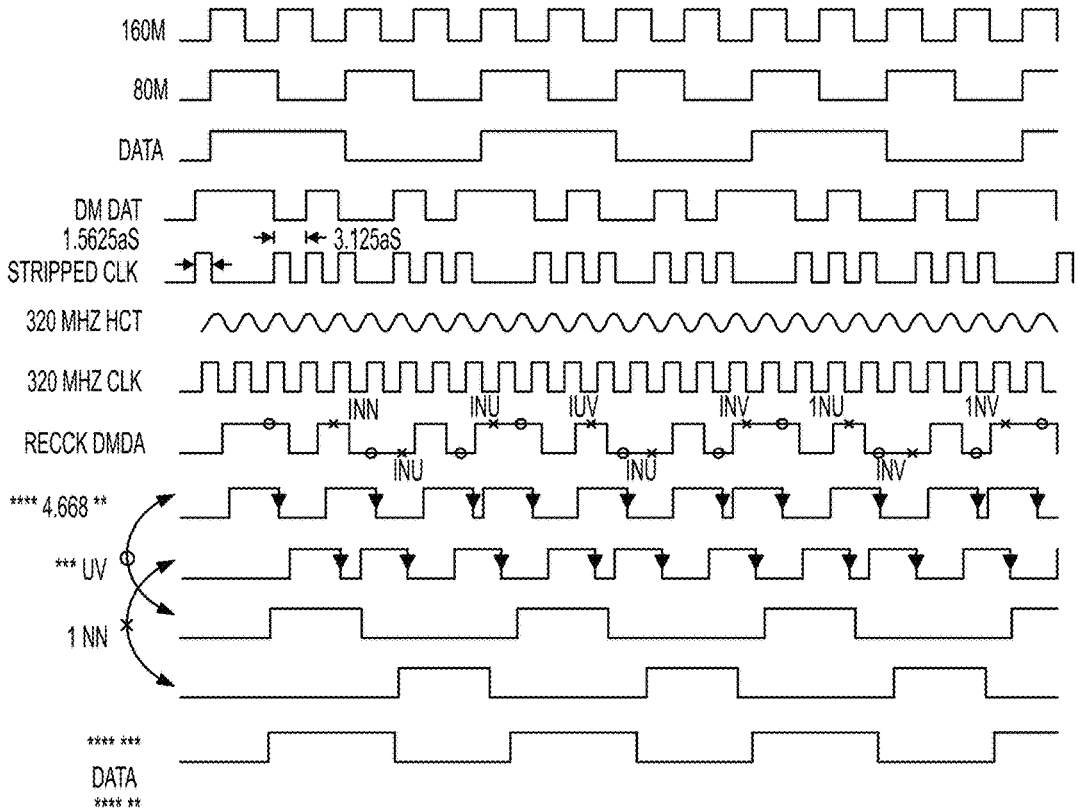
Figure 9A:
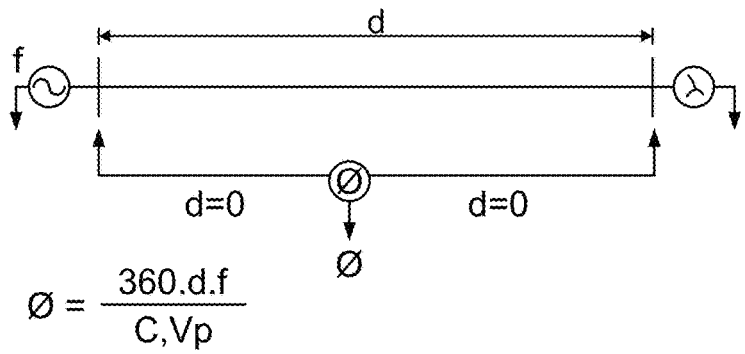
Figure 9A:
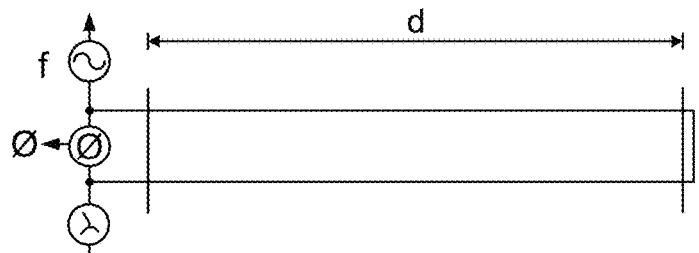
Figure 9A:
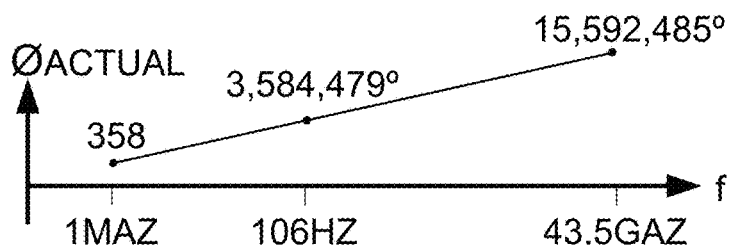
Figure 9C:
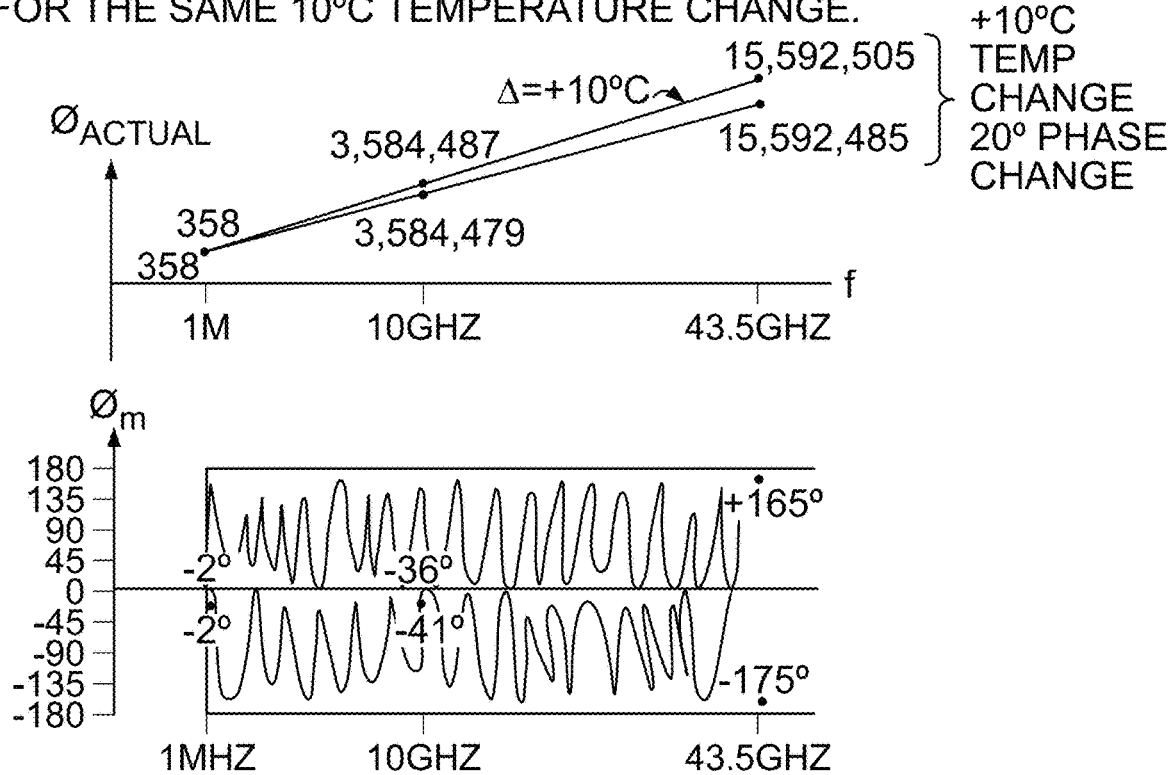
Figure 9C:
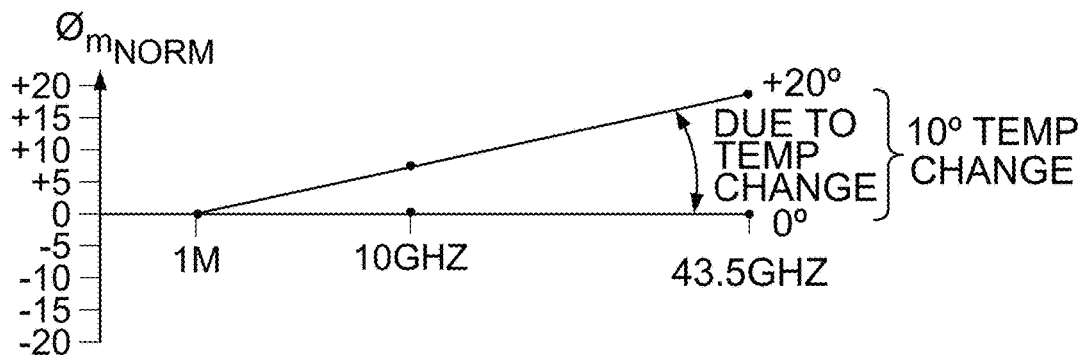

In a preferred embodiment inexpensive 625 MB/S SFPs and a simple SerDes implementation for the Zero Latency multi port Instrument implementation can be used where all instruments have access to the data simultaneously with only the transport delay due to distance between units. The system is illustrated in FIGS. 8A-8E. The system can be implemented in multi-port VNA system described above. Other instruments can also use the technique for synchronization as well as data transfer. FIG. 8A shows multiple VNA modules 800, 801, 802, 803, and 815, connected via a duplex fiber connection 810. FIG. 8B shows connections to the duplex fiber connection within on one of the VNA modules e.g. 801. FIG. 8C illustrates word block assignment for the VNA modules 800, 801, 802, 803, and 815, connected via a duplex fiber connection 810. FIG. 8D illustrates data receive and send circuits within the VNA modules, connected via a duplex fiber connection. Each unit within the ring sees the data packet and can insert data in the output packet. FIG. 8E illustrates data extraction within the data receive and send circuits of FIG. 8D.

The advantages include: Simple implementation in FPGA; minimal design time for FPGA implementation; low cost SFP use for interconnects; and all fiber interconnect of VNA modules thereby avoiding the problems of coupling to the copper cable and allowing for use of the VNA modules in a wide variety of applications where copper connectors are undesirable as described above.

Wide Band Frequency Transmission Over a Band Limited Medium

Figure 12A:
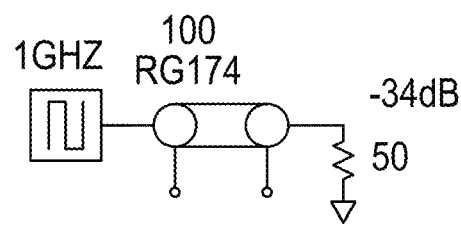
FIGS. 12A-12G illustrate wide band frequency transmission over a band limited medium suitable for a multi-port modular VNA system according to an embodiment.
Figure 12B:
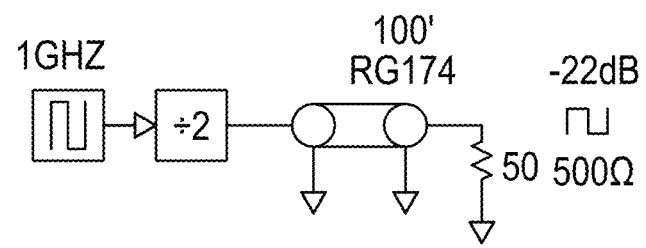
Figure 12C:
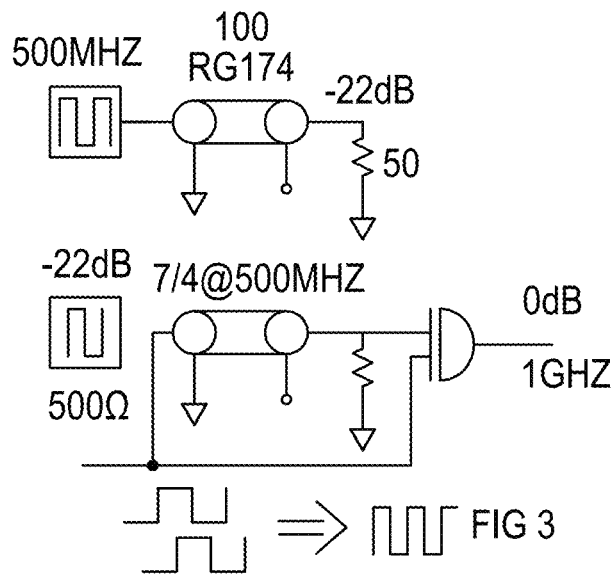
Figure 12D:
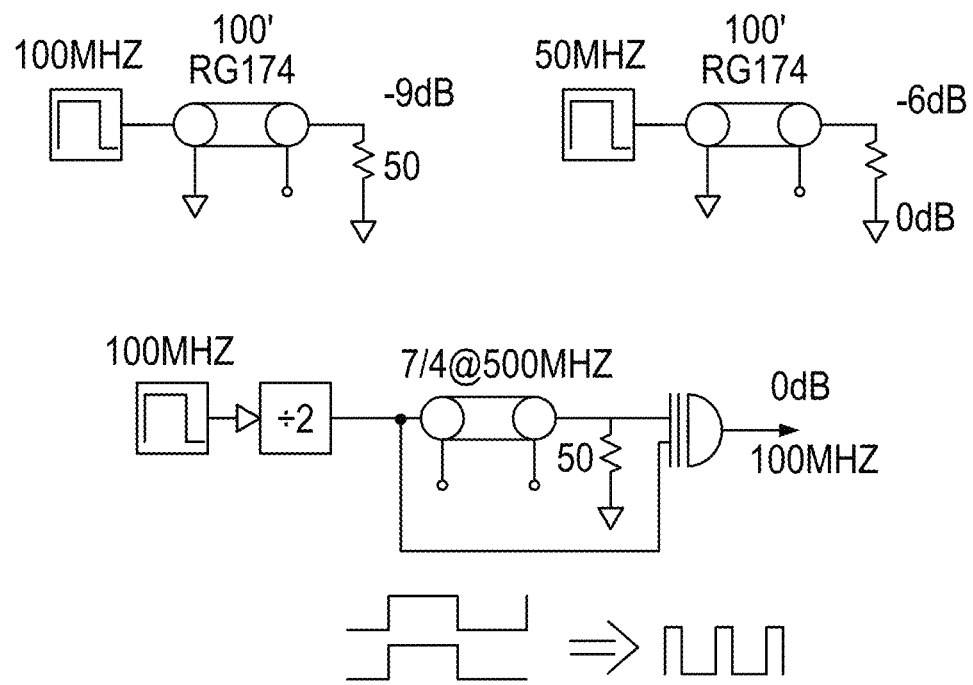
Figure 12E:
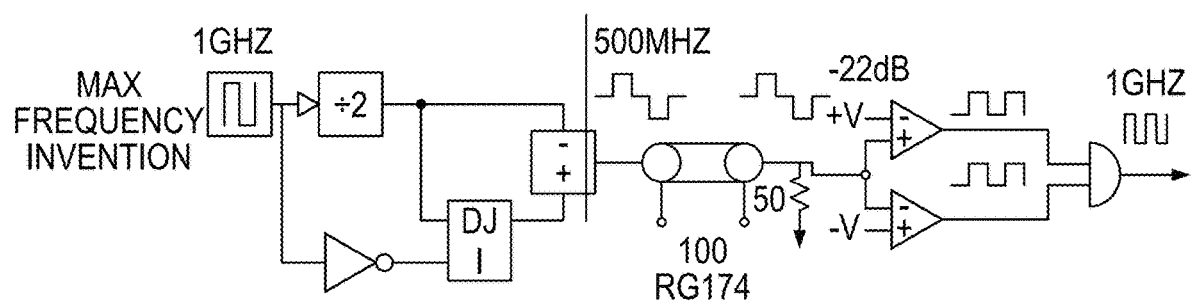
Figure 12F:
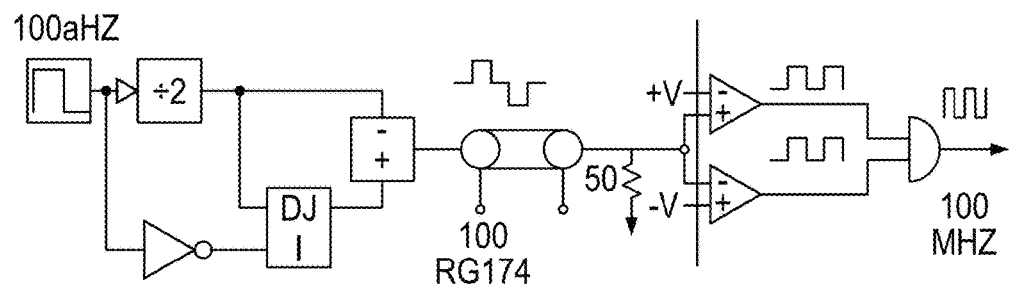

RF cable length used for extension of mm heads are limited due to cable loss at uWave drive frequencies (FIG. 12A.) Expensive power hungry power amplifiers are needed to make up for the loss for greater distances. Simple divide by N counters (FIG. 12B) are used to reduce the frequency for lower loss, but must be multiplied back up at the cable end. Complex schemes are needed to replicate the desired frequency and square wave. A simple ExOr gate in conjunction with a 90 deg delay line (FIG. 12C) will work at a fixed frequency, but soon loses its square wave output (FIG. 12D.)

Figure 12G:
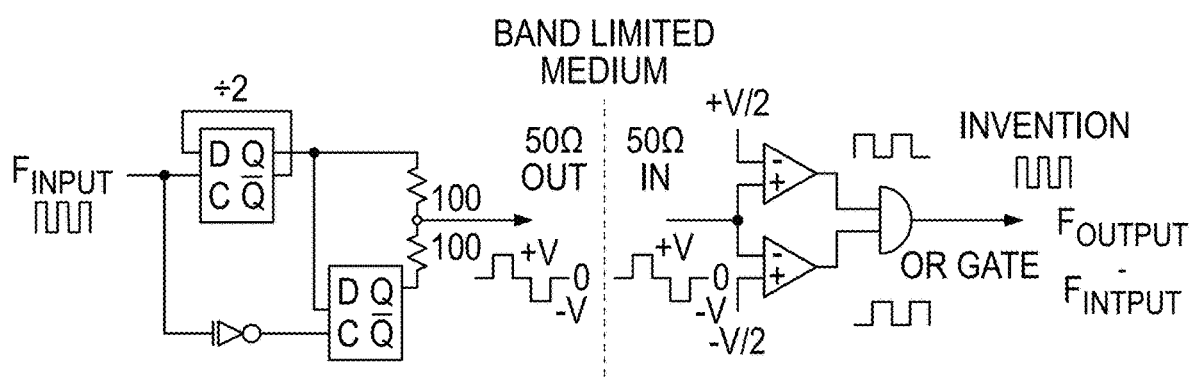

The invention relates to minimizing the loss of a signal in a band limited medium by reducing the frequency of the drive signal. FIGS. 12A-12G illustrate wide band frequency transmission over a band limited medium suitable for a multi-port modular VNA system according to an embodiment. As shown in FIGS. 12-12G a lower frequency drive signal is changed to include a phase delayed component needed to easily construct the original drive signal. Although a simple case using a divide by 2 is shown, any power of 2 divider can be used. A simulation using a divide by 16 with 4 equal length cables has been run with expected results. Each cable is driven with an 8 step waveform with each cable waveform separated by 11.25 degrees. The simulated cable was a CAT 6A 4 pair 500 MHz cable used in 1 0gb Ethernet. The drive signal was 8 GHz the 4 500 MHz signals were combined back into an 8 GHz signal. The square wave drive signal was reproduced at all frequencies down to 1 MHz. A possible use case would be the replacement of the LO distribution cable (50 Ohm low loss coax useable to 5 meters) with a CAT 6A or CAT 7 Ethernet cable bundle for use up to 100 m in the modular multiport VNA system.

In embodiment the system for wide band frequency transmission over a band limited medium suitable for a multi-port modular VNA system retain the original waveform with no multiplying noise. Additionally the drive signal can be AC coupled. The system is not limited to divide by 2 and can be used with other divide by integers, for example 4, 8, and 16. Divided by 16 has been simulated.

Additionally the system allows for frequency division demultiplexed to spread over multiple low frequency phase matched mediums.

Bandwidth Reduction

The modular VNA system may utilize bandwidth reduction of 2 or more phase coherent signals on a frequency varying baseband providing averaging of complex divide numbers in a varying data coherent environment. The Bandwidth reduction system and method is illustrated in FIGS. 12A-12G.

The use of averaging, as a means of reducing noise in signal received from a DUT, typically relies on constant DC values with noise added. Averaging removes the noise while retaining the DC value. In the user case, where averaging is used as bandwidth reduction on down converted Real and Imaginary terms, this implies a fixed IF mixing with a fixed reference producing fixed DC real and imaginary values along with system induced noise. In this case, averaging real and imaginary terms of the Reflected divided by the Incident individually then applying the averaged values to the complex divide, produces the equivalent of a lower noise reduced bandwidth S parameter measurement.

This technique is used on all VNA and other devices where bandwidth reduction is needed. It is convenient as no additional memory is needed to accumulate the average total when analyzing the signal. Only one memory location is needed per term allowing a running sum to be accumulated. A simple divide by the number of averages at the end and a single complex divide results in the noise reduced S parameter value.

However problems arise where the IF of a VNA is drifting with respect to the reference used to down convert the signal into real and imaginary baseband signals. This problem may arise when RF and LO are separated and locked to individual low loop bandwidth reference signals as described for example in the high isolation configuration below.

When the IF of a VNA is drifting with respect to the reference used to down convert the signal into real and imaginary baseband signals, averaging in the traditional manner produces unacceptable results. If the IF drift due to the slowly varying reference signals is wider than the required average equivalent bandwidth, the result will be averaged measurements with varying magnitude of several dB and varying phase of 100 s of degrees.

The solution to this problem is the use of instantaneous complex division and summing the results. This can be visualized as Incident and Reflected or Incident and Transmitted down converted real and imaginary DC values drifting + and − while retaining their relationship with each other. Taking an instantaneous measurement at any time then taking the complex divide will produce a stable S parameter measurement. Averaging these measurements will produce the desired noise reduction. This technique is used in multiport modular VNA system when the LO and RF synthesizers are separated by great distance and synchronized with a common low frequency reference. It can also be used for noise bandwidth reduction due to atmospheric delay distortion on two closely spaced receive signals as used in non-referenced distance measurements described in U.S. Pat. No. 5,832,369.

Time Base Distribution over USB3

Present distribution of Time Base signals occur on dedicated coax cables. The invention uses the USB3 Super Speed reference clock as a means for Time Base distribution. FIGS. 11A-11F illustrate time base distribution over USB3 suitable for a multi-port modular VNA system according to an embodiment. FIGS. 11A-11F illustrate Time Base inputs and outputs for hubs 1100 and distribution of the signal within the hubs 1100. The Figures illustrate host and remote side hubs. The host generates the time base signal which is distributed to the remote hub or hubs.

Any device using USB3 Super Speed can be modified to enable this feature. The featre can be used with a dedicated Portable Universal Hub. One Hub will act as a local source and one or more Hubs will act as receivers. The local source is driven by a host PC and an external high accuracy time base reference clock. If no external time base input is available, an internal time base reference will be used. The source as well as all the remote receivers will have the common time base available on all USB ports. The novelty in the invention is the use of a high accuracy time base as the reference for the USB3 Hub Integrated Circuit in the source module. The resulting up stream spread spectrum NRZ data at the remote modules are then processed and the original time base clock is recovered. Uses include instruments that require a common time base, such as synchronized Synthesizers, Spectrum Analyzers, multiport Vector Network Analyzers controlled by USB3 Super Speed. These instruments will have the additional circuitry needed to extract the master time base from the USB Super Speed protocol. The remote hubs can provide the extracted time base as an optional output connection.

Figure 10A:
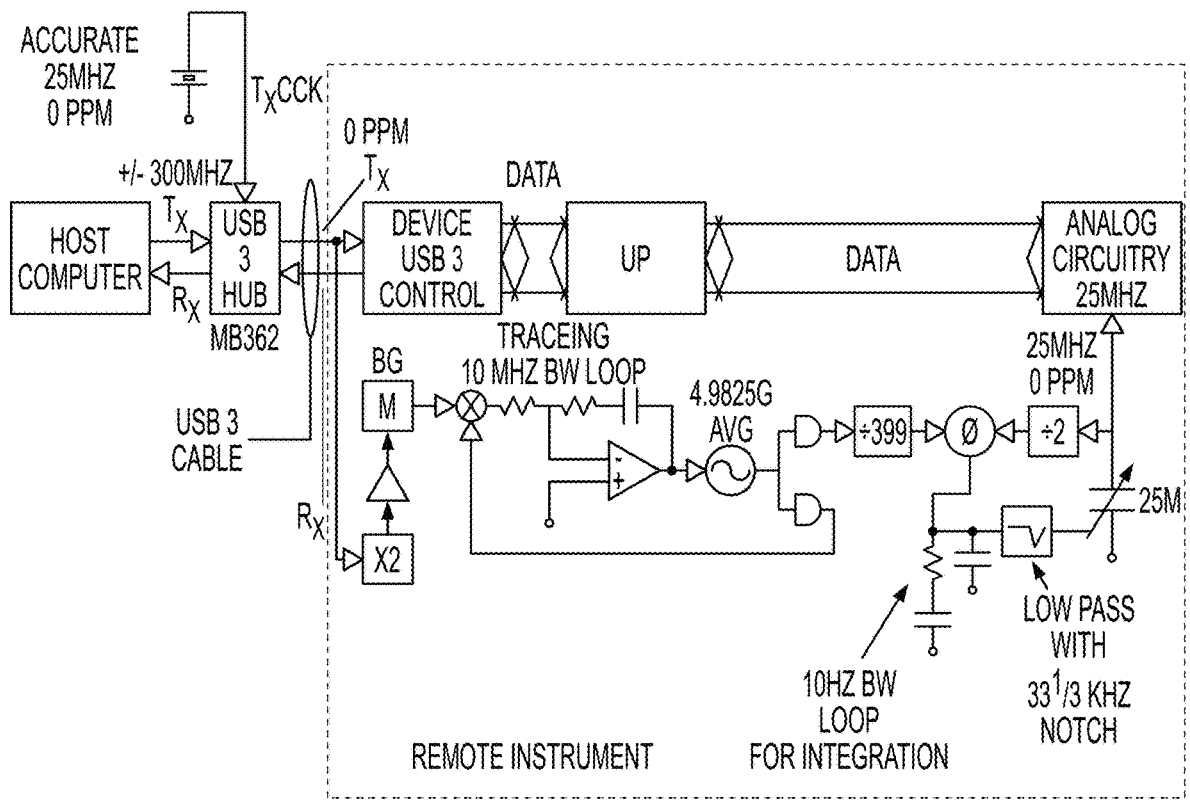
FIGS. 10A-10B illustrate clock regeneration over USB suitable for a multi-port modular VNA system according to an embodiment.
Figure 10A:
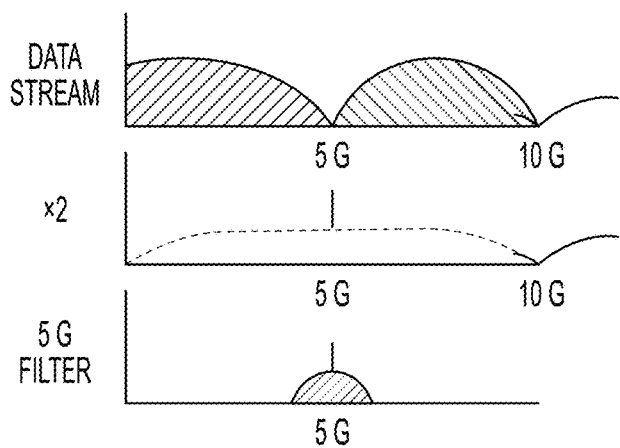
Figure 10B:
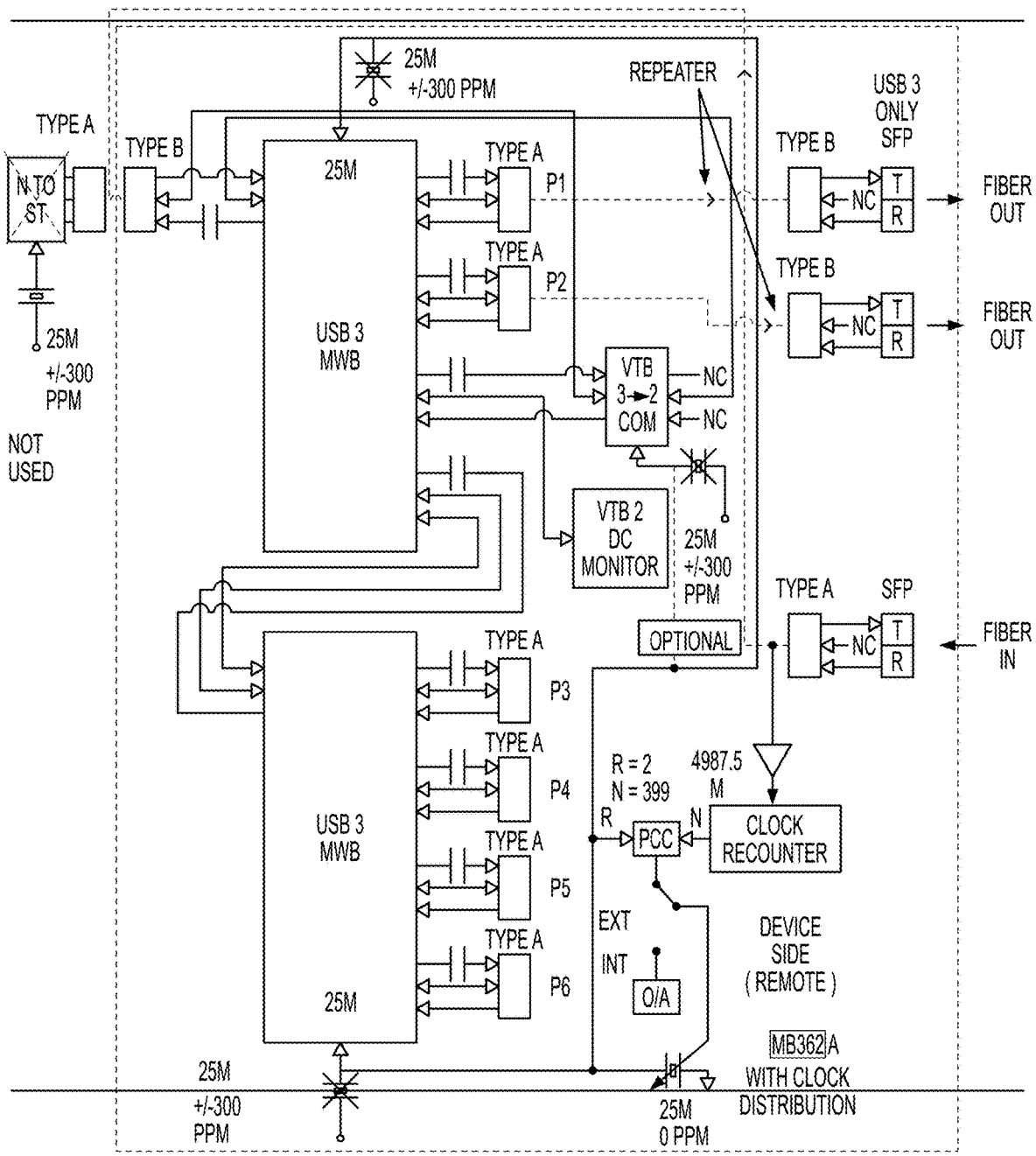
Figure 11A:
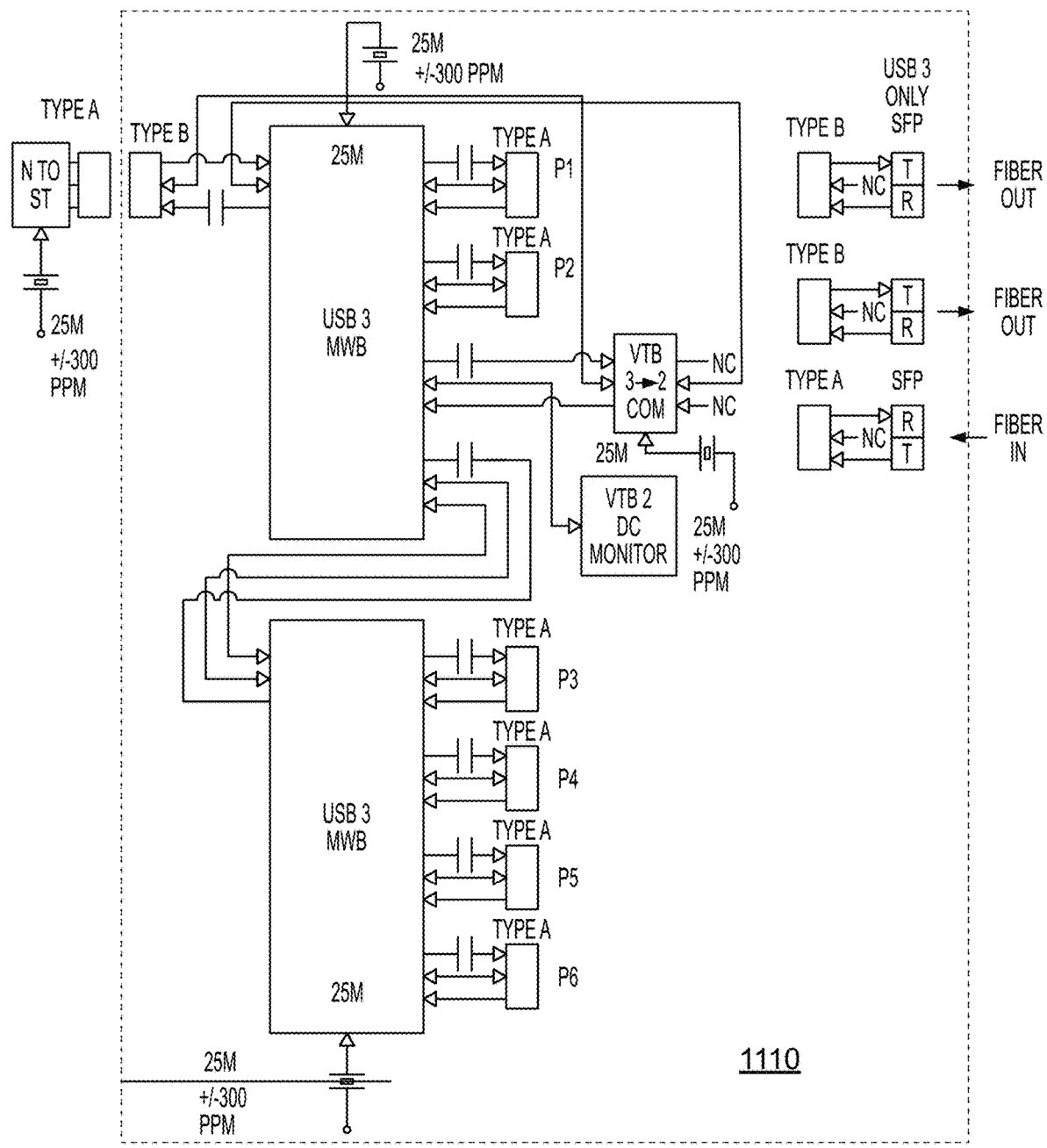
FIGS. 11A-11F illustrate time base distribution over USB3 suitable for a multi-port modular VNA system according to an embodiment.
Figure 11B:
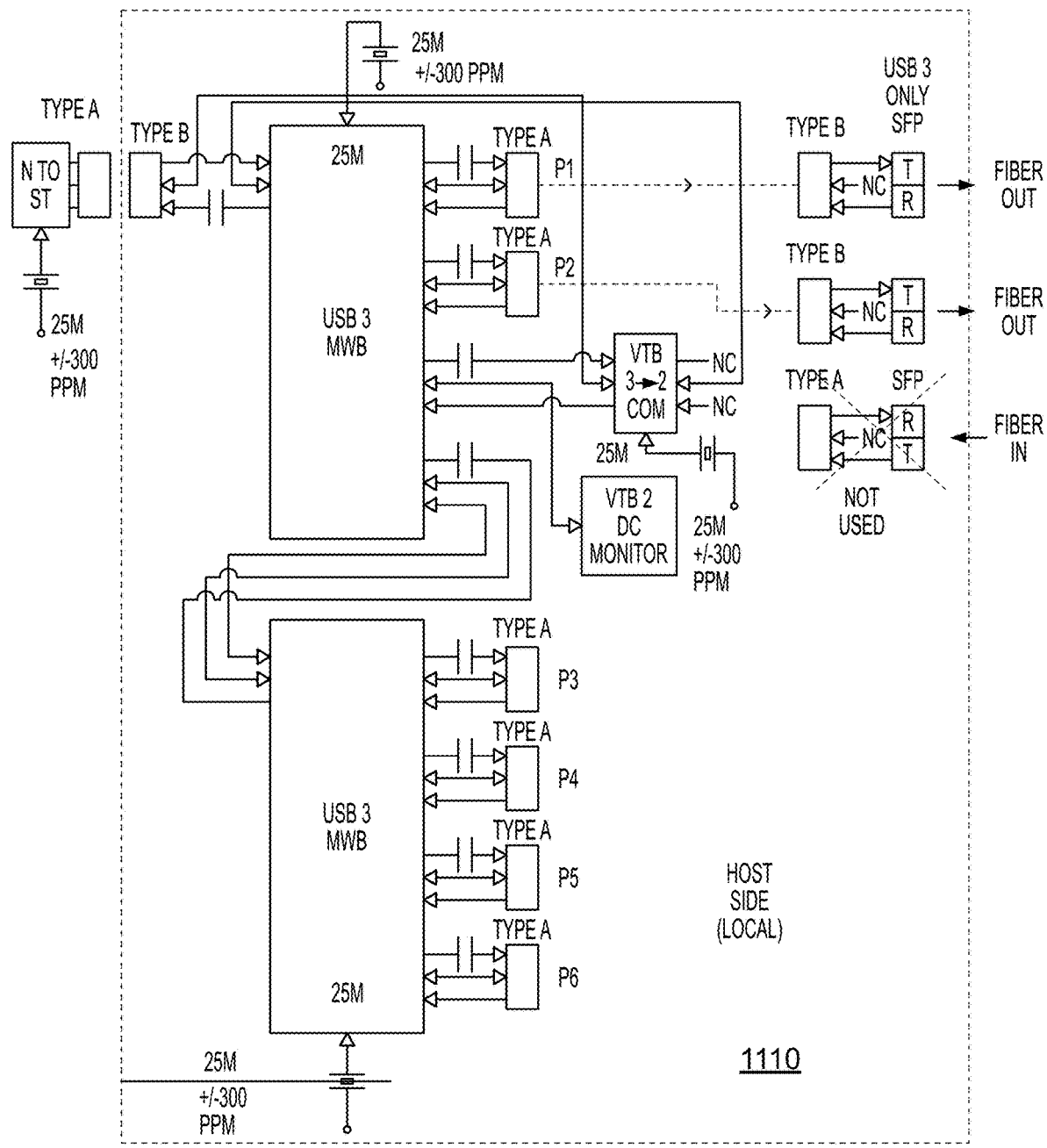
Figure 11C:
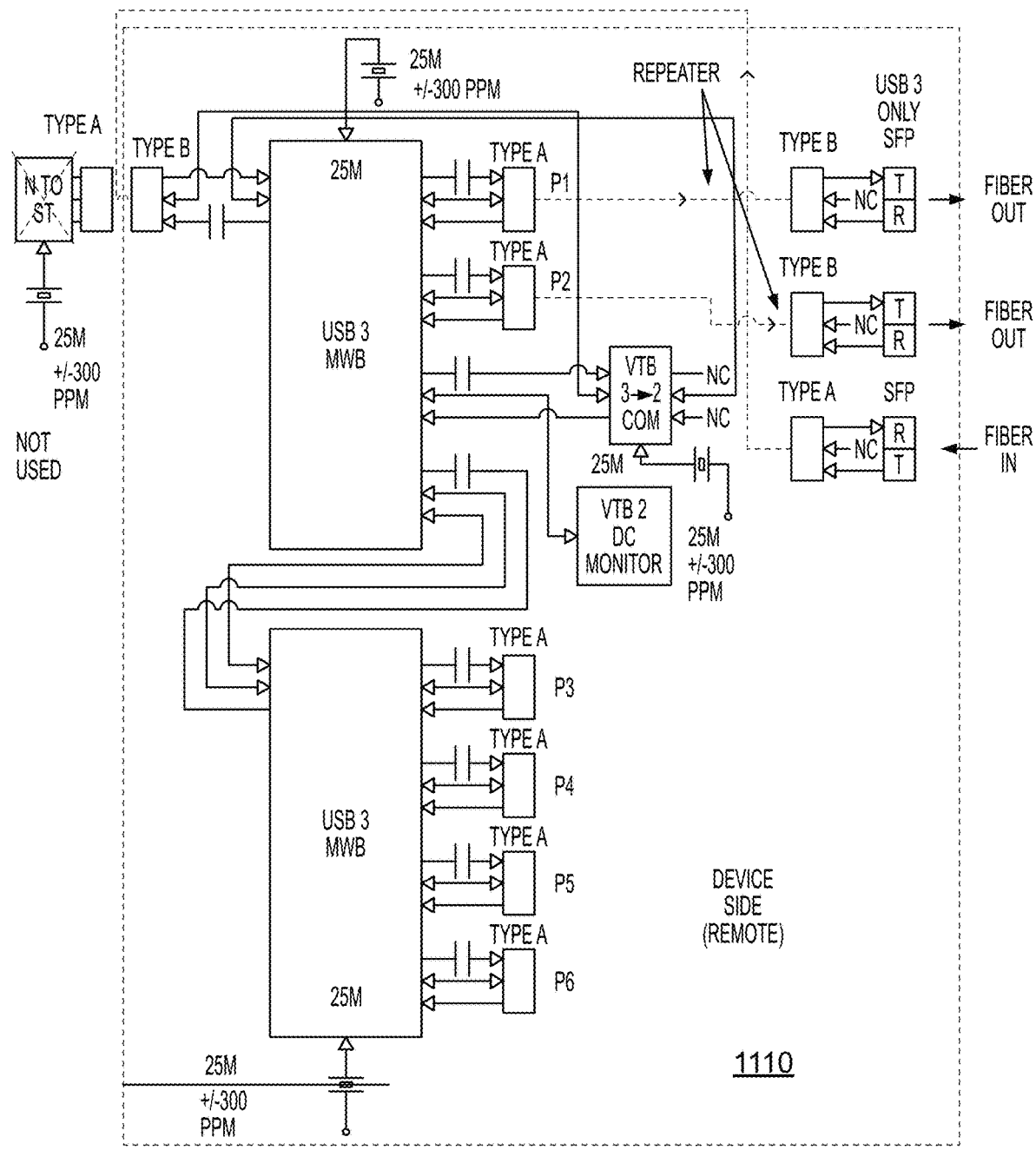
Figure 11D:
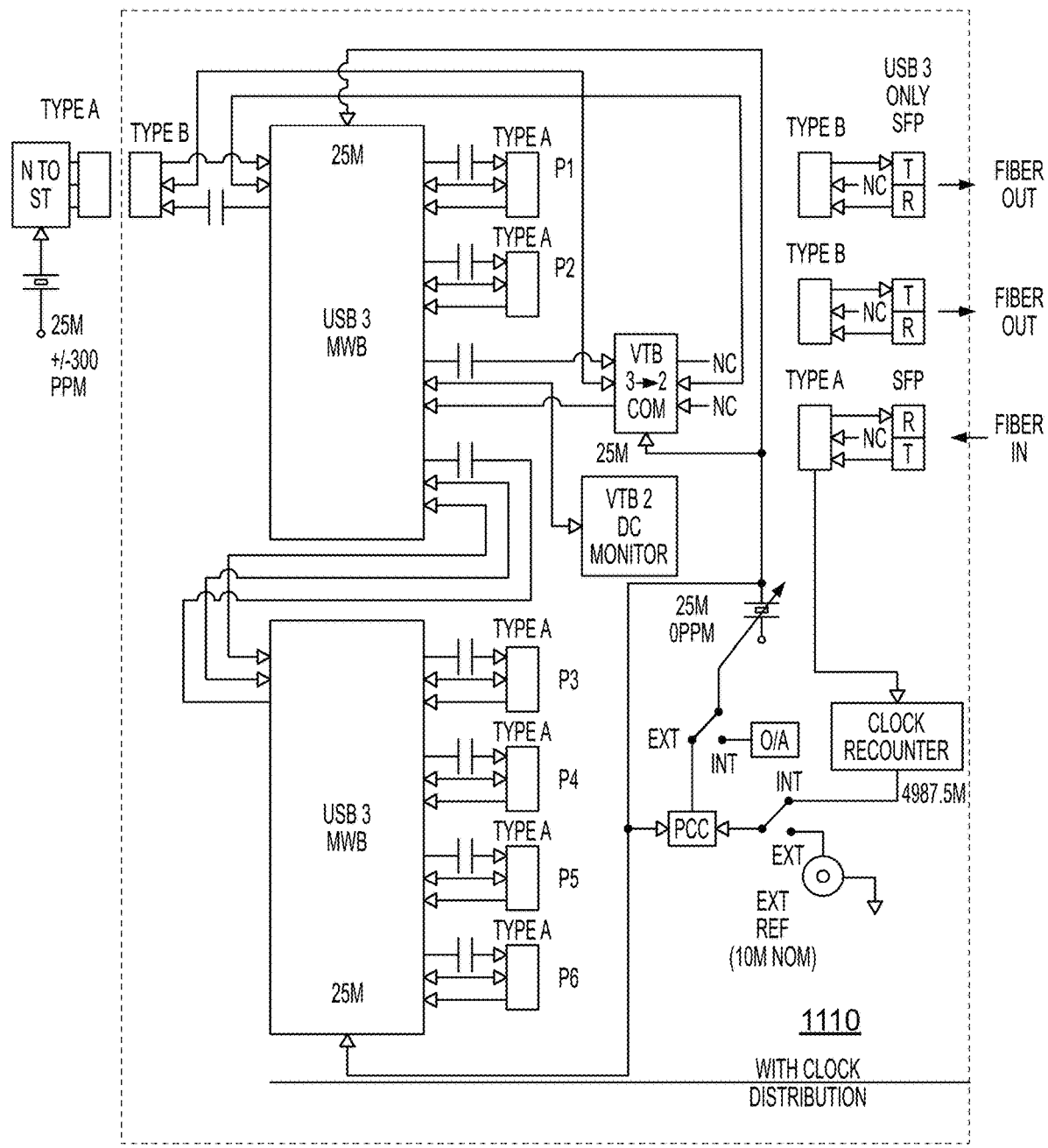
Figure 11E:
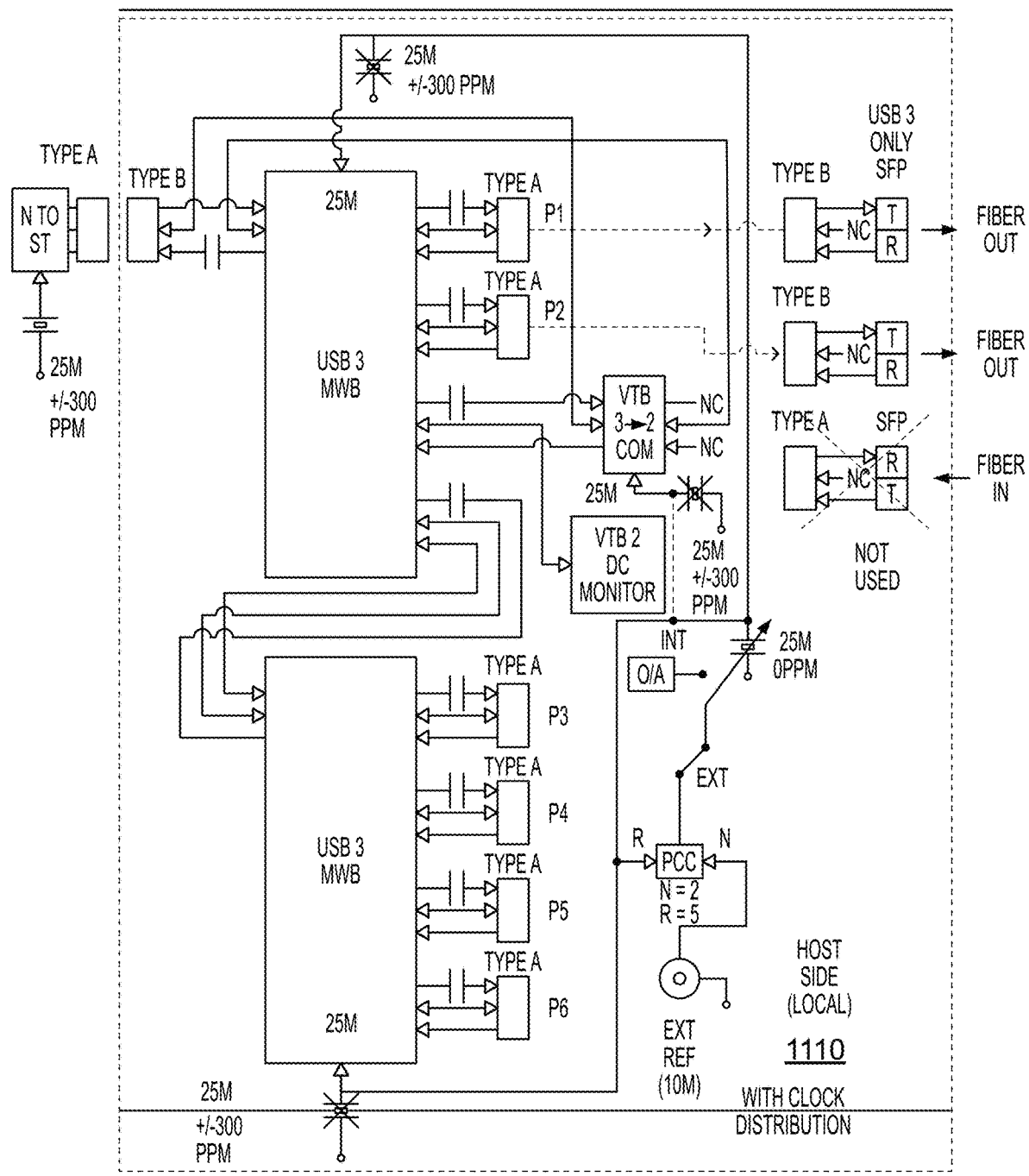
Figure 11F:
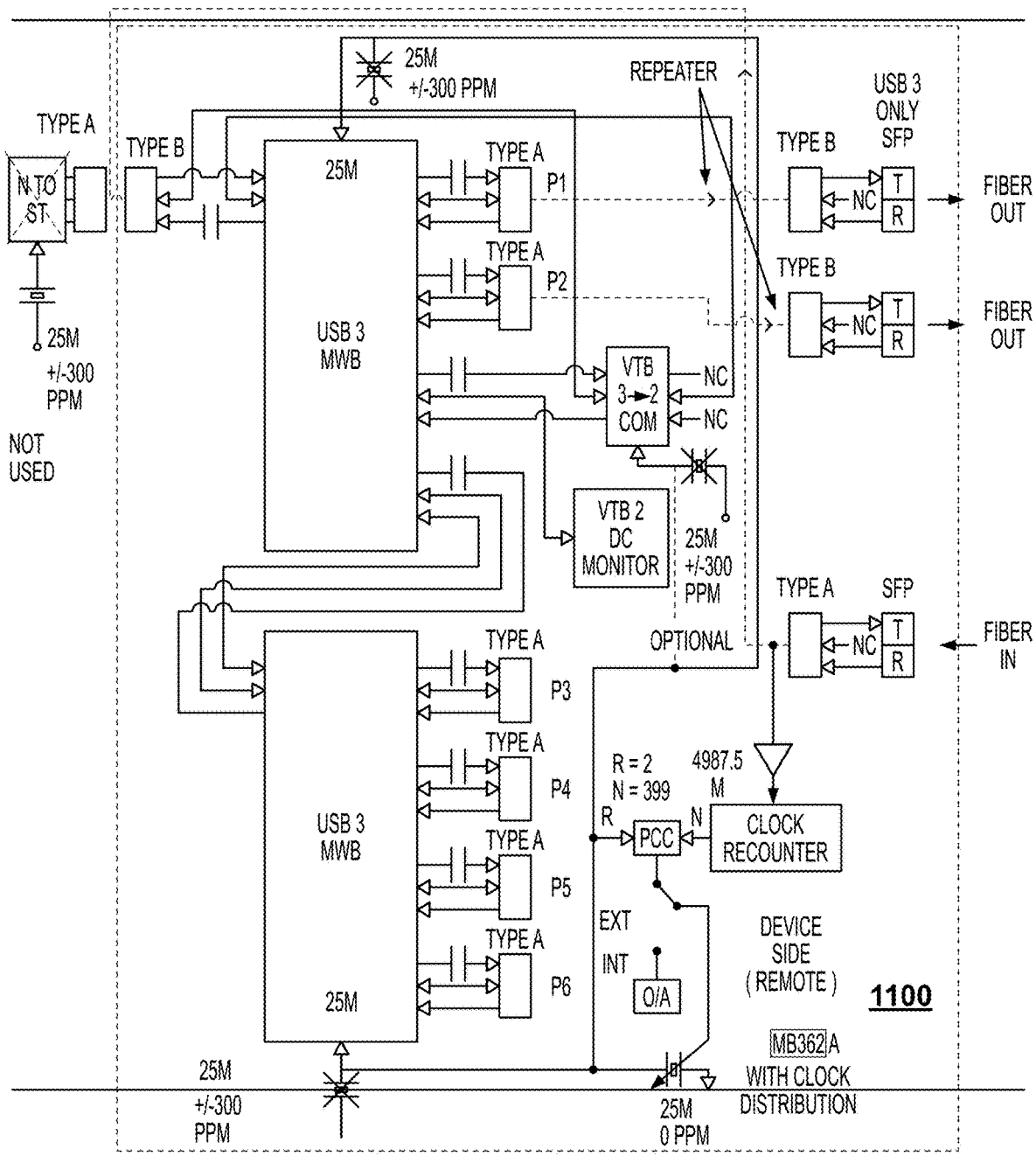

Advantages include a means of distributing a reference clock over USB Super Speed; the ability to use existing USB 3 cables for interconnect up to 5 m; ability to use Fiber Optic extension up to 300 m; ability to use point to point uWave distribution up to 1.85 km+; and no requirement to modify the implementation of the USB Super Speed specification Clock Recieneration Over USB Present distribution of Time Base signals occur on dedicated coax cables. The invention uses the USB3 Super Speed reference clock as a means for Time Base distribution. Any device using USB3 Super Speed can be modified to enable this feature. The system can be implemented in the dedicated Portable Universal Hub such as the extender modules of FIGS. 2A-2D. FIGS. 10A-10B illustrate clock regeneration over USB suitable for a multi-port modular VNA system according to an embodiment.

The SuperSpeed architecture supports a separate reference clock source on each side of the SuperSpeed link. The accuracy of each reference clock is required to be within +−300 ppm. This gives a maximum frequency difference between the two devices of the link of+−600 ppm. In addition, SSC creates a frequency delta that has a maximum difference of 5000 ppm. The total magnitude of the frequency delta can range from −5300 to 300 ppm. This frequency delta is managed by an elasticity buffer that consumes or inserts SKP ordered sets.

One Hub will act as a local master and one or more Hubs will act as slaves. The local master will be driven by a host PC and an external high accuracy time base reference clock. If no external time base input is available, an internal time base reference will be used. The Master as well as all the remotes will have the common time base available on all USB ports. The novelty in the invention is the use of a high accuracy time base as the reference for the USB3 Hub Integrated Circuit in the master. The resulting up stream spread spectrum NRZ data at the remotes are then processed and the original time base clock is recovered. Uses include instruments that require a common time base, such as synchronized Synthesizers, Spectrum Analyzers, multiport Vector Network Analyzers controlled by USB3 Super Speed. These instruments will have the additional circuitry needed to extract the master time base from the USB Super Speed protocol. This allows the time base to be regenerated from the data stream on the USB 3 cable eliminating the extra cable.

The clock regeneration over USB3 is illustrated in FIGS. 10A and 10B.

A means of regenerating a reference clock from the data stream of a USB Super Speed connection. The system can use existing USB 3 cables for interconnect up to 5 m. The system can also use Fiber Optic extension up to 300 m and can use point to point uWave distribution up to 1.85 km+. The system does not change the operation of the USB Super Speed specification. The USB Serial Bus 3.0 Specification Revision 1.0 Nov. 12, 2008 is incorporated herein by reference to describe the properties of the USB Super Speed Specification.

High Isolation

The modular VNA system can, in embodiments, utilize high Isolation configuration for individual synchronized VNAs separated by large distances. The high isolation configuration is explained with references to FIGS. 5A and 5B Existing 2 port VNA solutions rely on extensive shielding to prevent the Test Port RF signal from leaking into the Receive Port. This leakage signal appears as a valid signal near the noise floor when two loads are placed on the two Ports. It also limits the dynamic range of the measurement. Shielding and careful placement of components in the VNA layout reduce this to negligible levels. However this solution is expensive for best in class isolation. It should be noted that the isolation leakage term is stored during calibration and subsequently removed during measurement. The leakage term soon returns when the actual DUT is in place. This is partly due to the impedance at the ports being different than the calibration devices used when measuring the isolation term. Thus conventional isolation techniques and calibration methods can be expensive and problematic.

This present systems and methods provide a solution to the problem of RF Isolation between Ports on a multi-port VNA. The modular multi-port VNA system is a perfect example of isolation by virtue of distance. Isolation should approach undetectable levels given enough distance between terminated ports. Unfortunately this is not the case as there remains a path for RF to get to the receive mixer by the LO input. The mixer LO to RF isolation allows this leakage signal to appear as a valid input signal. This is the case in a normal system where one unit supplies both the RF and LO signals. The LO is supplied to the source Incident mixer and the distant receive mixer for S21 forward transmission measurements. Extensive shielding and parts placement must still be implemented to keep the RF from leaking onto the LO signal routed to the distant receiver.

Figure 5A:
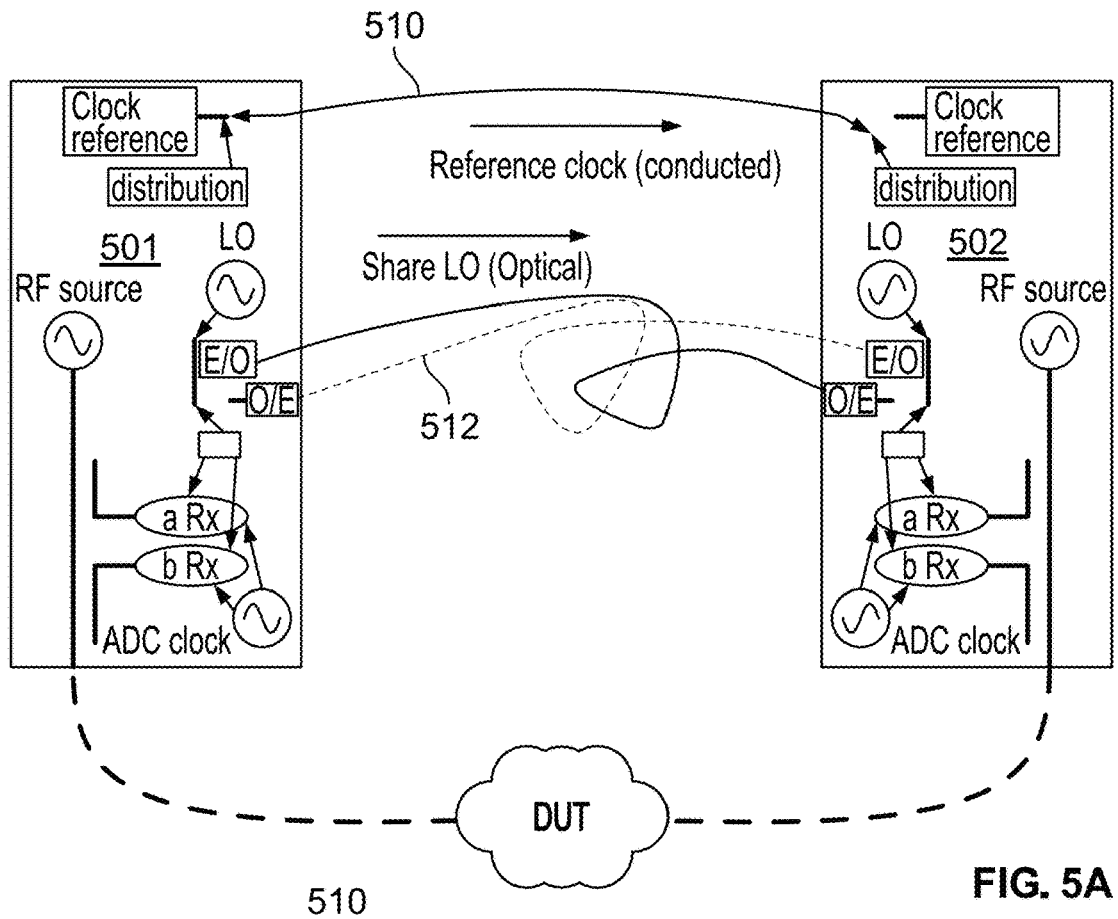
FIGS. 5A and 5B illustrate a high isolation configuration for a modular two-port VNA system according to an embodiment.
Figure 5B:
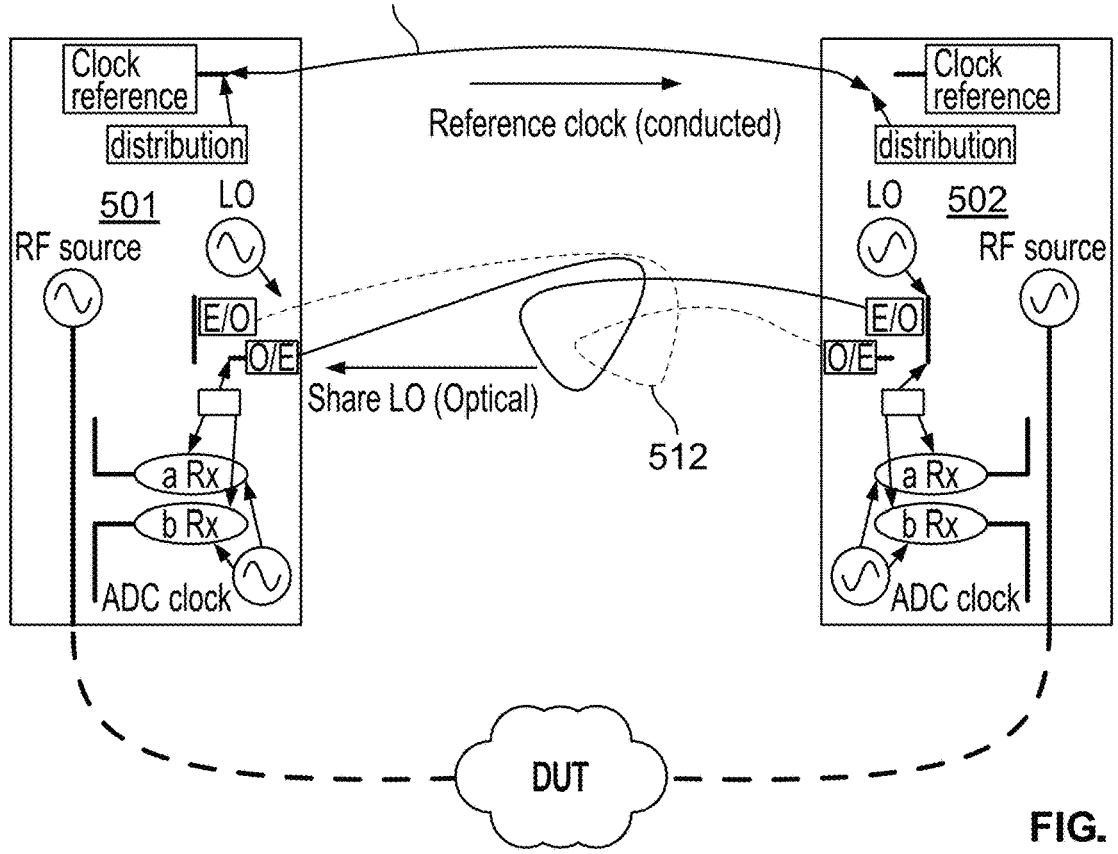

However, the modular multi-port VNA system has the distinct advantage of having two independent RF and LO sources available (sources are present in each module). As shown in FIGS. 5A and 5B the reference and a new signal "Sync" are transferred using twisted pair copper conductors 510 between VNA module 501 and VNA module 502. The LO is transmitted over optical cables 512 enabling long distance separation due to low transmission loss in fiber at Microwave frequencies. The use of optical connections for transmission of LO is much more robust than transmission by conventional coaxial cables. By using the LO in the receive unit and sending it back to the source unit for the incident mixer the problem leakage signal path is eliminated. Essentially, different VNA modules of the modular system are used to provide the RF and LO signals providing inherent isolation while reducing the need for shielding and parts placement. The signal transmission path for the LO returning to the source module must have very high reverse isolation otherwise the RF signal will travel back into the receive unit supplying the LO and cause the same problem. The modular multi-port VNA system uses a full duplex E/O and O/E transmission path for the LO with separate paths for each direction. This allows infinite isolation to the RF path as RF does not travel in the reverse direction on a fiber link.

In a fully-corrected two-port measurement, the ports on the different modules alternate in driving the stimulus signal (RF source). The default LO behavior in the pair of single port VNA modules is that the module providing the port stimulus also provides the LO signal (so it also alternates) as shown in FIG. 5A because of the way the RF and LO signals are synthesized, this provides some advantages in high level noise (trace noise).

The sharing that helps trace noise, however, can degrade isolation particularly at lower (<8 GHz) frequencies. Thus a High Isolation mode is available that improves dynamic range (without isolation corrections) to the 100 dB range in a 10 Hz IF bandwidth at the expense of some degradation in trace noise (roughly a doubling). In the High Isolation mode, the module that is NOT sourcing the RF signal is used as the LO generator as shown in FIG. 5B. These two configurations are illustrated in FIGS. 5A and 5B for the case when the RF source on module 501 is driving (the LO directions shown in the figures will be reversed for both if the RF source of module 502 is driving). FIG. 5A shows the normal mode and FIG. 5B shows the High Isolation mode configuration.

Because of the different signal paths used, a calibration performed in default mode cannot be used in High Isolation mode and vice-verse. A calibration should be performed again (or recalled) when switching between these modes. The normal/High Isolation mode selection is per-channel and, as such, will be retained in setup files being saved and recalled. The mode is selectable via a control interface. Note that the cable length is also entered via an interface (the fiber cable connecting the modules) which helps the system automatically adjust synchronization timing.

The differences in LO sharing between normal (default, FIG. 5A and High Isolation modes (FIG. % B) are illustrated here for the case when the RF source of module 1 is driving (e.g., in a S21 or S11 measurement). In the normal case, the module generating the RF stimulus will also provide the LO. However, the opposite module will provide the LO in the High Isolation case. The LO is shared over an optical fiber with the help of electrical-to-optical and optical-to-electrical converters at either end.

A further special case relates to those calibrations that make use of switch-term load match corrections (LRL, LRM, TRL, TRM, SOLR, SSLR and SSSR). In these calibrations, a different configuration is automatically used where the same module is always used for LO generation (the port 2 module by default but this can be changed). This mode is automatically activated when one of the above calibrations is performed or applied. No separate mode selection is needed and the behavior will override any High Isolation selections. This does have the side effect of the instrument behaving like the default configuration in one transmission direction (generally S12) and like the High Isolation mode in the other direction (generally S21). Those parameter assignments will be reversed if, instead, the port 1 module is chosen to always provide the LO.

High RF isolation between ports on a multi-port VNA allows for near infinite isolation between distantly separated VNA modules in a modular VNA system. The high RF isolation mode can be used in remote multi-receiver setups. The high isolation mode can be implemented in multi-port modular VNA system in a selectable high Isolation mode.

Multi-Segment Distributed Temperature Measurement

In an embodiment a modular multiport VNA can measure bulk or distributed temperature on a pair of hard line conductors. Existing technologies use temperature sensors at specific locations. Disadvantages include spot temperature readings of specific locations causing the use of many sensors to indicate the bulk temperature accurately. The present invention utilizes a single pair of conductors in a party line arrangement as a measurement and data retrieval means. The conductors are connected between modules at different locations. The difference between this approach and the discrete sensor approach is that it determines the temperature of the segments connecting between the nodes rather than the temperature at the nodes. Essentially the system measure the average line temperature of the conductor between the nodes.

Figure 6A:
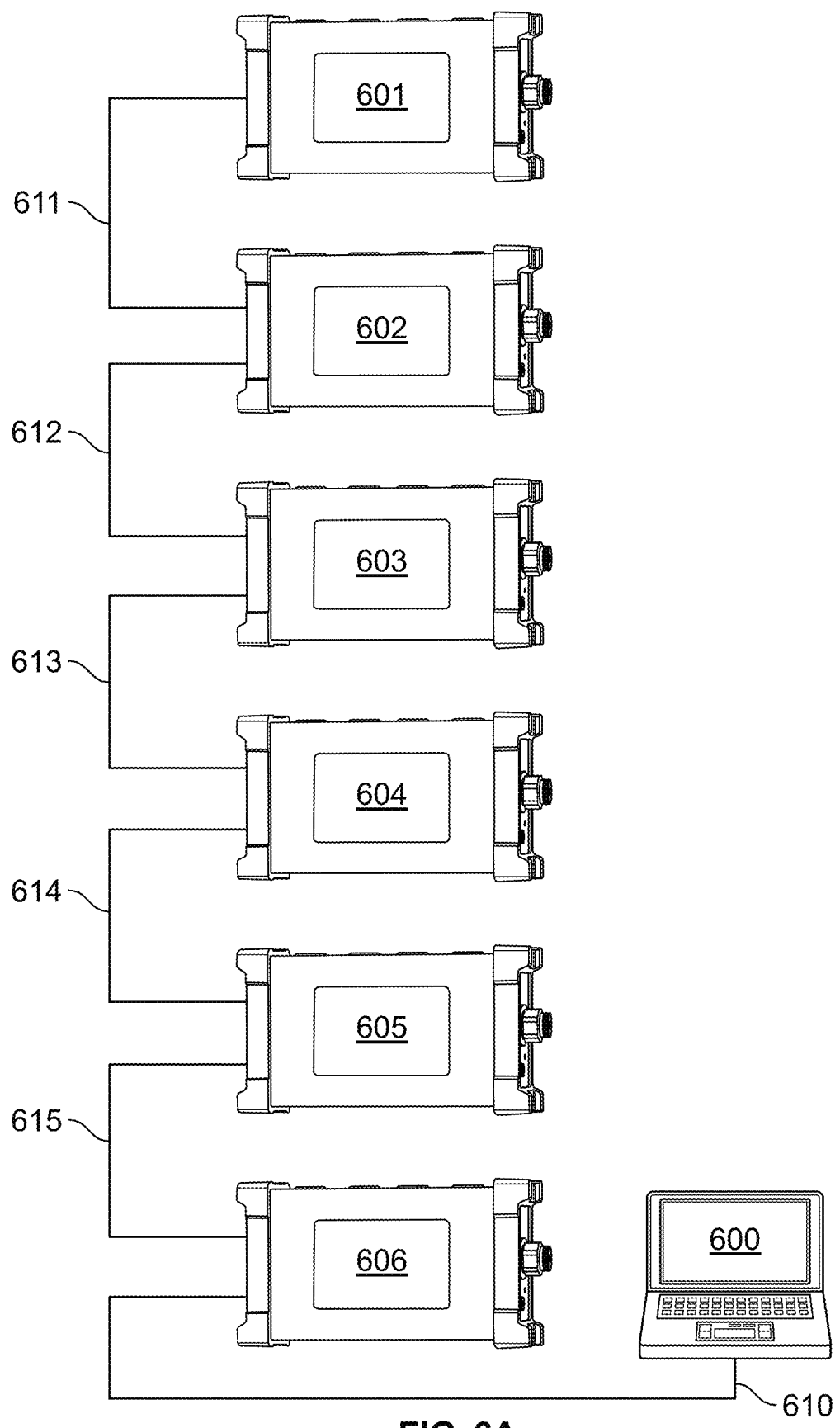

As shown in FIG. 6A, each unit is connected to all the others in a Daisy Chain configuration. Each Daisy Chain bundle contains a Fiber Optic LO, a diff pair 10 MHz reference signal, for the RF output when the channel is active, a diff pair 400 KHz sync signal used to make simultaneous IF measurements, a party line diff pair channel Ready/Busy signal and a party line diff pair used for cable temperature measurements to compensate the LO fiber Optic signal path. There is control in each unit allowing it to either short the party line differential pair or measure the resistance across the pair. The cable temperature is derived from the change in the round trip resistance measurement from the measuring unit to the desired unit by shorting the cable at the desired unit.

The purpose of this invention is to measure the bulk temperature of the cable assembly containing a temperature phase sensitive fiber optic cable and compensating the phase change through temperature phase lookup table.

The advantages include: Bulk/distributed temperature measurement over a pair of conductors with multi segment capability; measures temperature of link between nodes; unlimited nodes; can use any conductor material for pair; and node hardware can be powered by measurement pair.

In an example, as shown in FIG. 6A, six VNA modules 601, 602, 603, 604, 605, 606 are daisy chained with five cables 611, 612, 613, 614, 614, 615. Cable 611 is 1 m in length, cable 612 is 6 m, cable 613 is 25 m cable 614 is 50 m and cable 615 is 100 m for a total length of 181 m. Short the connectors in unit 1 and measure resistance at unit 6. The other units are left open. Measurement data can be provided to computer 600 via cable 610 for analysis and display. Example temperature analysis is shown in FIG. 6B and 6C.

Fast Algorithm For Arranging Objects in Shortest Order

As shown in FIGS. 6A a system and method can be provided for determining temperatures in interconnects between nodes. However it may be necessary or desirable to determine the order of the nodes of the system. Existing NP-complete problems like the Traveling Salesman Problem (TSP) rely on complex algorithms to determine a route between nodes. However, due to the simple structure of a string of nodes with two endpoints a simpler solution can be used to determine the order of nodes in the type of system shown in FIG. 6A allows a more minimal approach to be used.

Figure 7A:
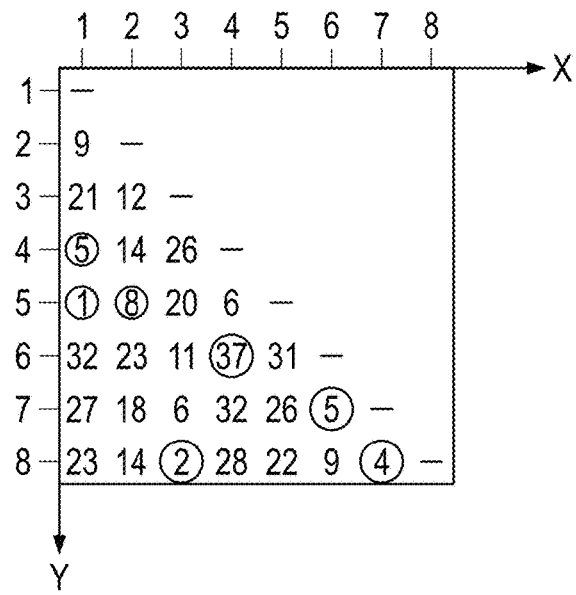
FIGS. 7A-7B illustrate fast algorithm for arranging N objects in shortest order implemented with performed with a multi-port modular VNA system according to an embodiment.
Figure 7B:
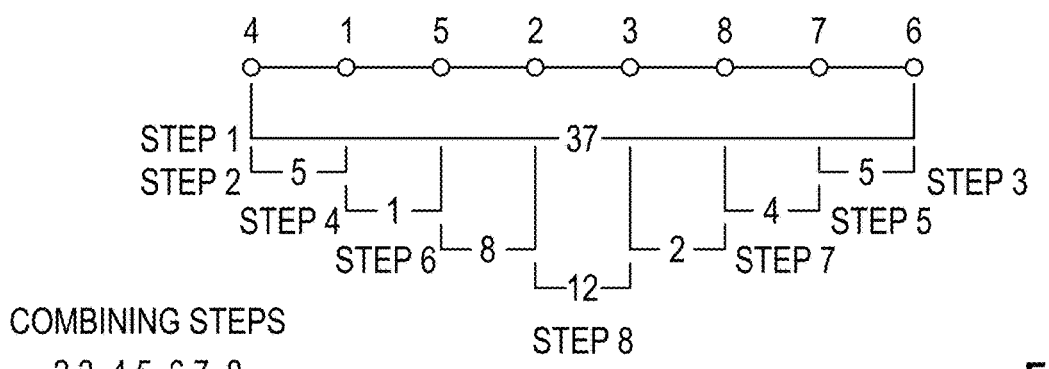

The invention uses a quick search algorithm to determine the order of connection nodes on a multi node party line system. The intended use is the ordering of multiport modular VNA instruments remotely to determine bulk temperature between instruments for fiber optic temperature compensation. FIGS. 7A-7B illustrate fast algorithm for arranging N objects in shortest order implemented with performed with a multi-port modular VNA system according to an embodiment. The advantages include: Calculates node order in reduce number of steps $-N^3$ v $N!/2$ steps; the technique can be used in other class problems In an example, there are 16 one Port VNAs scattered at an Antenna Test Site. (FIG. 6A but with 16 nodes and 15 interconnects). Each unit receives its power from a local 12V supply. Each unit is controlled by a USB connection to the program control PC. Each unit is connected to all the others in a Daisy Chain configuration. Each Daisy Chain bundle contains a Fiber Optic LO, a diff pair 10 MHz reference signal, for the RF output when the channel is active, a diff pair 400 KHz sync signal used to make simultaneous IF measurements, a party line diff pair channel Ready/Busy signal and a party line diff pair used for cable temperature measurements to compensate the LO fiber Optic signal path. There is control in each unit allowing it to either short the party line differential pair or measure the resistance across the pair. The cable temperature is derived from the change in the round trip resistance measurement from the measuring unit to the desired unit by shorting the cable at the desired unit. To properly determine the temperature of each cable we have to determine the two units on either side of a cable.

The problem arises when we try to determine the interconnects of all the units. The first thing needed is to number all the units. We can do this by arbitrarily assigning the numbers 1 through 16 to the ascending Serial Numbers The next step is to construct a list of resistance measurements between each unit and all the other units. The table doesn't have to include mirror measurements or self-measurements, i.e. Unit 5 to Unit 8 can be used for Unit 8 to Unit 5, and there are no Unit X to Unit X measurements. This table contains 120 entries $\{(nx(n-1))/2\}$ a brute force calculation of this table contains n !/2 combinations, (2.1×10A13) For 8 units the calculation time is about 1 Minute. For 16 units the scaled calculation time would be 519×10A6 minutes or about 1000 years.

FIGS. 7A and 7B illustrate use of the method to determine the order of 8 units. To solve this problem it is necessary to list the order of the units and the resistance between them. While studying an 8×8 table derived from an arbitrarily constructed 8 unit interconnected system, with arbitrary resistances assigned between units. This can be solved algorithmically. Analysis of the algorithm reveals ~nA3 calculations, <1 second for n=16. The algorithm core first finds the end units, then finds the next two units connected to the end units in sequential steps illustrate in FIGS. 7A and 7B working towards the center until the middle pair or middle unit is detected. This dramatically reduces the number of calculations required to determine the order of the nodes. The advantage increases exponentially as the number of nodes is increased. Thus, ordering of distributed nodes for temperature measurements can be performed quickly and efficiently even when there are large numbers of nodes.

Solar Power Battery Backup

Remote instrumentation such as the multi-function extender can be provided with solar panels to charge the battery in remote locations where mains power is inaccessible. Remoting of instrumentation over great distance over fiber optic control requires Duplex user control, uninterruptable power. Additionally, it is desirable for unattended sites to provide a way of completely disabling all battery draining functions remotely (i.e. without visiting the remote site) while still retaining the capability to start back up after a sufficient period of time allowing the battery enough time to harvest sufficient charge to operate normally. This power conservation technique is also is needed for night time operation when the battery is almost depleted with no available solar charging and day time operation when battery power is almost depleted and minimal solar energy is available for extended periods to enable complete charge.

Remote systems typically contain a battery pack and some form of simplex or duplex control. The control can be wireless Ethernet for high isolation, or they can be totally supported by Power over Ethernet. However, wireless Ethernet is plagued by uncontrolled excessive latency delays, high RF fields at the transmitter frequency as well as no provision for complete shut down for battery conservation. Furthermore, power over Ethernet requires a copper connection with limited length. Extended length Ethernet operation again causes uncontrolled excessive latency delays. Fiber Optic Ethernet connection allows isolation and fast latency time but again, no complete shut down for battery conservation. Once the battery drains, all operation is lost. When solar power returns and all circuits are connected and ready to resume. Solar power must be sufficient to continuously operate the instrumentation as well as supply charge to the battery otherwise the system will cycle off and on due to blockage of the Sun by cloud cover resulting in no charge getting to the battery. When the device is need there is no guarantee the battery will have sufficient charge for operation.

The present solution solves problems related to the support of remotely controlled instrumentation at very long distances. Specifically, unattended operation with the use of a Solar Panel is described. The solution can support many USB controlled instruments at distances up to 5 km at full speed operation.

In an embodiment a solar panel is used to provide input power to the DC charging port of the multifunction extender shown in FIGS. 2A-2D. The solar panel is sized or regulated to provide DC in the required range of +15V to +23V at 6 Amps. The internal power module 227 of the extender 200 can use the input power from the solar panel to charge the internal battery 210.

The invention can supply power and control multiple instruments simultaneously due to the expandable USB Hub and high capacity battery source 210. Complete remote system shut down is accomplished by disconnecting the Fiber Optic link leaving all available charging current available for battery charging. The link can be left disconnected for days or weeks if no Sun is available due to cloudy weather. Once the link is re-established, a quick inquiry of battery status from battery monitor 211 and available charge current from the solar panel can be made to determine if prolonged operation or one shot operation is warranted. Once data has been collected, the link can be broken again for further high priority charging.

In particular, the remote system awakes upon Fiber Optic link connection with a special process. Link connection is determined by a short burst of power applied to the Fiber Optic receiver. If a signal is detected on the receiver, full power is restored to the USB Type A output connector. This connector is typically routed to the Hub USB Type B input connector which brings up the Hub to full functionality. The short burst of power required is low enough to allow months of unattended operation on a fully charged battery.

In embodiment the multi-function extender can provide solar power battery backup in a remote Instrument controller with Fail Safe Remote shutdown. This allows complete shut-down of remote site (including accessory devices such as remote receivers/VNA modules powered and controlled by the extender) allowing non shared current for battery charge. Furthermore upon startup the system allows for quick inspection of available charge current and available battery charge allowing for determination of remote site readiness for operation. This techniques can also be used with dedicated USB or Ethernet implementation. The remote unit can be easily configured to be a Local unit with different cabling connections.

In some embodiments, the present invention includes a computer program product, for example DCM 15, which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention. It is intended that the scope of the invention be defined by the following claims and their equivalents.

The invention claimed is:

1. A method for phase synchronization of two or more remote ports of a modular multiport vector network analyzer, the method comprising:
  connecting a test port with a second port via a first cable having a first length;
  performing a calibration;
  performing fiber cable length measurement on the first cable and storing the measured length for the first cable;
  connecting the second port with the test port via a second cable having a second length, the second length different from the first length;
  performing fiber cable length measurement for the second cable;

subtracting the stored measured length for the first cable from the measured length for the second cable and using the difference to determine a phase adjustment needed at each frequency point to produce a flat phase response; and calibrating the phase of the two or more remote ports.

2. A method for phase synchronization of two or more remote ports of a modular multiport vector network analyzer, the method comprising:
performing an absolute receiver calibration at the remote ports;
normalizing the phase to 0 degrees;
rotating an a1 phase and an a2 phase to match a normalized b1 and a normalized b2;
performing an absolute power calibration of the output powers of the remote ports;
rotating all phase values to 0 degrees;
performing a calibration on the remote ports of the vector network analyzer;
measuring a phase response to determine a phase difference between two remote ports due to a fiber-optic cable having a first length;
performing a fiber cable length measurement on the fiber-optic cable to determine a phase adjustment needed at each frequency point to produce a flat phase response; and
calibrating the phase of the two or more remote ports.

3. A modular multiport vector network analyzer system comprising:
a system for synchronizing source signals with remote receivers, the system for synchronizing source signals comprising:
a first vector network analyzer having a first port to couple to an input port of a device under test;
a second vector network analyzer having a second port to couple to an output port of the device under test;
calibration circuitry coupled to the first port and the second port for use in calibrating the first vector network analyzer and the second vector network analyzer; and
circuitry to measure a length of a fiber-optic cable using a Delta F Fiber length measurement routine, the fiber-optic cable coupled between the first vector network analyzer and the second vector network analyzer, the circuity to further determine a difference between lengths of two fiber-optic cables coupled one-at-a-time between the first vector network analyzer and the second vector network analyzer to determine a phase adjustment needed at each frequency point to produce a flat phase response and to calibrate the phase of the first port and the second port.

4. A modular multiport vector network analyzer system comprising:
a system for bandwidth reduction comprising:
a first vector network analyzer having a first port;
first circuitry coupled to the first port to measure an a1 vector at an input port of a device under test;
a second vector network analyzer having a second port;
second circuitry coupled the second port to measure a b2 vector at an output port of a device under test; and
a computing device coupled to the first vector network analyzer and the second vector network analyzer, the computing device to complex divide the b2 vector by the a1 vector for each measurement in a series of measurements of b2 and a1, and provide an average of the results of the complex division for the measurements in the series of measurements.

5. A modular multiport vector network analyzer system comprising:
a system for high isolation of Radio Frequency (RF) and Local Oscillator (LO) sources, the system for high isolation comprising:
a first vector network analyzer having a first port and comprising:
first circuitry coupled to the first port to provide a first RF signal to measure an a1 vector at an input port of a device under test; and
a first local-oscillator circuit to receive a first local-oscillator signal;
a second vector network analyzer having a second port and comprising:
second circuitry coupled the second port to receive a second RF signal to measure a b2 vector at an output port of the device under test; and
a second local-oscillator circuit coupled to provide the first local-oscillator signal to the first local-oscillator circuit.

6. A modular multiport vector network analyzer system comprising:
a solar power system for remote sites with optical activation, the solar power system comprising:
a solar panel;
a multi-function extender coupled to receive power from the solar panel and comprising:
a fiber-optic receiver;
power circuitry to provide a burst of power to the fiber-optic receiver; and
receiving circuitry coupled to the fiber-optic receiver to determine if data is being received during the burst of power, and if it is, then to apply the power to a first logic output of the multi-function extender.

7. The method of claim 1 further comprising, before connecting the test port with a second port via a cable having a first length, performing absolute power measurement of the test port and setting a power source at the test port to a first power level.

8. The method of claim 7 wherein the calibration is a 12 term Open-Short-Load-Thru (OSLT) calibration.

9. The method of claim 8 wherein the first length is 1 meter.

10. The method of claim 9 wherein the second length is 100 meters.

11. The method of claim 10 wherein the first power level is 0 dBm.

12. The method of claim 2 wherein the calibration is an Open-Short-Load (OSL) calibration.

13. The modular multiport vector network analyzer system of claim 3 wherein the calibration circuitry comprises Open-Short-Load (OSL) calibration circuitry.

14. The modular multiport vector network analyzer system of claim 13 wherein the lengths of two fiber-optic cables are 1 meter and 100 meters.

15. The modular multiport vector network analyzer system of claim 4 wherein the first circuitry is further coupled to the first port to measure a b1 vector at the input port of the device under test, and wherein the computing device divides the b1 vector by the a1 vector for each measurement in a series of measurements of b1 and a1, and provide an average of the results of the complex division for each measurement in the series of measurements.

16. The modular multiport vector network analyzer system of claim 5 wherein the first circuitry is further coupled to receive a third RF signal to measure a b1 vector at an input port of a device under test and the second circuitry is further coupled to provide a fourth RF signal to measure an a2 vector at an output port of a device under test, and wherein the first vector network analyzer further comprises a third local-oscillator circuit to provide a second local-oscillator signal and the second vector network analyzer further comprises a fourth local-oscillator circuit to receive the second local-oscillator signal from the third local-oscillator circuit.

17. The modular multiport vector network analyzer system of claim 16 wherein the first local-oscillator signal is received by the first local-oscillator circuit over a first fiber-optic cable and the second local-oscillator signal is received by the fourth local-oscillator circuit over a second fiber-optic cable.

18. The modular multiport vector network analyzer system of claim 17 wherein the first vector network analyzer comprises a reference clock coupled to provide a reference clock signal to the second vector network analyzer over a wired conductor.

19. The modular multiport vector network analyzer system of claim 6 wherein the first logic output is a universal-serial bus output.

20. The modular multiport vector network analyzer system of claim 19 wherein when power is applied to the first logic output, power is applied to a universal-serial bus hub in the multi-function extender.

* * * * *